US012745624B2

(12) United States Patent
Masuda et al.

(10) Patent No.: US 12,745,624 B2
(45) Date of Patent: Sep. 22, 2026

(54) SEMICONDUCTOR MEMORY DEVICE

(71) Applicant: Kioxia Corporation, Tokyo (JP)

(72) Inventors: Takafumi Masuda, Kawasaki (JP); Mutsumi Okajima, Yokkaichi (JP); Nobuyoshi Saito, Ota (JP); Keiji Ikeda, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 362 days.

(21) Appl. No.: 18/601,745

(22) Filed: Mar. 11, 2024

(65) Prior Publication Data

US 2024/0312911 A1 Sep. 19, 2024

(30) Foreign Application Priority Data

Mar. 15, 2023 (JP) ................................ 2023-040298

(51) Int. Cl.

| | |
|---|---|
| ***H10W 20/41*** | (2026.01) |
| ***H10B 12/00*** | (2023.01) |
| ***H10W 20/42*** | (2026.01) |
| ***H10W 20/43*** | (2026.01) |

(52) U.S. Cl.

CPC ........ *H10W 20/435* (2026.01); *H10B 12/315* (2023.02); *H10B 12/482* (2023.02); *H10W 20/42* (2026.01); *H10W 20/43* (2026.01)

(58) Field of Classification Search

CPC ...................... H10B 12/31–318; H10B 12/482

See application file for complete search history.

(56) References Cited

U.S. PATENT DOCUMENTS

| | | | |
|---|---|---|---|
| 9,406,692 | B2 | 8/2016 | Lee |
| 9,514,792 | B2 | 12/2016 | Kajigaya |
| 10,629,538 | B2 | 4/2020 | Zhang |
| 2016/0358932 | A1 | 12/2016 | Yang |

(Continued)

FOREIGN PATENT DOCUMENTS

| | | |
|---|---|---|
| JP | 2022-147872 A | 10/2022 |
| JP | 2024-017785 A | 2/2024 |

(Continued)

OTHER PUBLICATIONS

U.S. Appl. No. 18/423,110, filed Jan. 25, 2024, Okajima et al.
U.S. Appl. No. 18/459,978, filed Sep. 1, 2023, Masuda et al.
U.S. Appl. No. 18/463,686, filed Sep. 8, 2023, Masuda et al.

*Primary Examiner* — Daniel P Shook
(74) *Attorney, Agent, or Firm* — Foley & Lardner LLP

(57) ABSTRACT

A semiconductor memory device includes a memory layer and a via-wiring extending in a first direction. The memory layer includes a semiconductor layer electrically connected to the via-wiring, a gate electrode including parts opposed to surfaces of the semiconductor layer on one side and the other side in the first direction, a memory portion disposed on one side in a second direction with respect to the semiconductor layer, and a wiring disposed on the other side in the second direction with respect to the semiconductor layer. In a cross-sectional surface perpendicular to the first direction and including one of the parts of the gate electrode, the via-wiring includes a surface opposed to the gate electrode and a surface not opposed to the gate electrode. A part of the gate electrode is disposed on a memory portion side with respect to the via-wiring in the second direction.

19 Claims, 36 Drawing Sheets

(56) References Cited

U.S. PATENT DOCUMENTS

2020/0211631 A1 7/2020 Karda et al.
2020/0227416 A1 7/2020 Lilak et al.
2020/0227418 A1 7/2020 Kim et al.
2020/0251151 A1* 8/2020 Kang ..................... H10B 12/03
2022/0005810 A1 1/2022 Kang et al.
2022/0102394 A1 3/2022 Liu
2022/0122974 A1 4/2022 Ryu et al.
2022/0130830 A1 4/2022 Yokoyama
2022/0130831 A1 4/2022 Lee et al.
2022/0130834 A1 4/2022 Lee et al.
2022/0310612 A1 9/2022 Okajima
2024/0038280 A1 2/2024 Masuda et al.
2024/0081042 A1 3/2024 Masuda et al.
2024/0087616 A1 3/2024 Masuda et al.
2024/0260253 A1 8/2024 Okajima et al.

FOREIGN PATENT DOCUMENTS

JP 2024-036259 A 3/2024
JP 2024-039345 A 3/2024
JP 2024-106917 A 8/2024

* cited by examiner

MCA
ML
103
ML
103
ML
103
ML
103
ML
103
Sub
MC
110(TrC)
130(CpC)
102(PL)
115
115
120(WL)
104(BL)
104(BL)
Z
X
Y

X
Z
Y
102(PL)
130(CpC)
131
132
133
134
135
136
137
115
104a
104b
104c
104d
104(BL)
111
112
113
110(TrC)
120(WL)
121
122
103
120(WL)
103

120(WL)
110(TrC)
Z
102(PL)
Y
X
122 121
111 112 113
130
(CpC)
103
ML
103
ML
103
131
132
133
134
135
136
137
A
A'
104d
104c
104b
104a
104(BL)

Z
Y
X
104A
103
103
103
MLA
MLA 101A
104A
Z
Y
X
103
103
103
MLA
MLA 101B
104A
Z
Y
X
103
MLA
103
MLA
103

101B
104A
111A
Z
Y
X
103
103
103
MLA
MLA 101B
104A
111B
113
111C
Z
Y
X
103
130B
103
103

101B
104A
111A
113
111C
Z
Y
X
103
103
103
130B

Z
Y
X
101B
104A
111A
113
103
130B
103
103

SEMICONDUCTOR MEMORY DEVICE

CROSS-REFERENCE TO RELATED APPLICATIONS

This application is based upon and claims the benefit of Japanese Patent Application No. 2023-040298, filed on Mar. 15, 2023, the entire contents of which are incorporated herein by reference.

BACKGROUND

Field

Embodiments described herein relate generally to a semiconductor memory device.

Description of the Related Art

In accordance with high integration of a semiconductor memory device, an examination for converting the semiconductor memory device into a three-dimensional form has been in progress.

DETAILED DESCRIPTION

Figure 1:
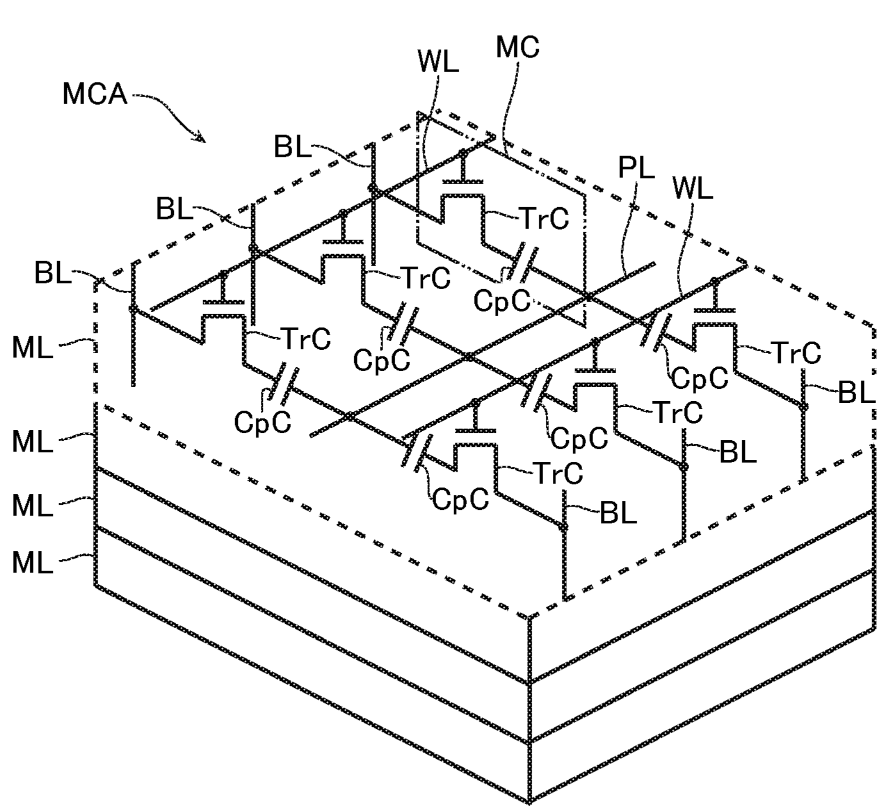
FIG. 1 is a schematic circuit diagram illustrating a configuration of a part of a semiconductor memory device according to a first embodiment.

A semiconductor memory device according to one embodiment comprises a substrate, a plurality of memory layers arranged in a first direction intersecting with a surface of the substrate, and a via-wiring extending in the first direction. The plurality of memory layers each include a semiconductor layer electrically connected to the via-wiring and a gate electrode. The gate electrode includes a first part opposed to a surface of the semiconductor layer on one side in the first direction and a second part opposed to a surface of the semiconductor layer on the other side in the first direction. The plurality of memory layers each include a memory portion disposed on one side in a second direction intersecting with the first direction with respect to the semiconductor layer and electrically connected to the semiconductor layer and a wiring disposed on the other side in the second direction with respect to the semiconductor layer, electrically connected to the gate electrode, and extending in a third direction intersecting with the first direction and the second direction. In a cross-sectional surface perpendicular to the first direction and including a part of the first part or the second part of the gate electrode corresponding to one of the plurality of memory layers, the via-wiring includes a first surface opposed to the gate electrode and a second surface not opposed to the gate electrode. A part of the gate electrode is disposed on a memory portion side with respect to the via-wiring in the second direction.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in an OFF state, the first transistor is "electrically connected" to the third transistor.

In this specification, when it is referred that the first configuration "is electrically connected between" the second configuration and a third configuration, it may mean that the first configuration, the second configuration, and the third configuration are connected in series and the second configuration is electrically connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on a substrate side of this configuration. An upper surface and an upper end of a certain configuration mean a surface and an end portion on a side opposite to the substrate of this configuration. A surface intersecting with the X-direction or the Y-direction is referred to as a side surface and the like.

In this specification, when it is referred that a "center position" of a certain configuration, for example, it may mean a position of a center of a circumscribed circle of this configuration or it may mean a center of gravity on an image of this configuration.

First Embodiment

Circuit Configuration

FIG. 1 is a schematic circuit diagram illustrating a configuration of a part of a semiconductor memory device according to the first embodiment. As illustrated in FIG. 1, the semiconductor memory device according to the embodiment includes a memory cell array MCA. The memory cell array MCA includes a plurality of memory layers ML, a plurality of bit lines BL connected to these plurality of memory layers ML, and a plate line PL connected to the plurality of memory layers ML.

The memory layers ML each include a plurality of word lines WL and a plurality of memory cells MC connected to these plurality of word lines WL. The memory cells MC each include a transistor TrC and a capacitor CpC. A source electrode of the transistor TrC is connected to the bit line BL. A drain electrode of the transistor TrC is connected to the capacitor CpC. A gate electrode of the transistor TrC is connected to the word line WL. One electrode of the capacitor CpC is connected to the drain electrode of the transistor TrC. The other electrode of the capacitor CpC is connected to the plate line PL. The respective bit lines BL are connected to the plurality of memory cells MC corresponding to the plurality of memory layers ML.

Structure

Figure 2:
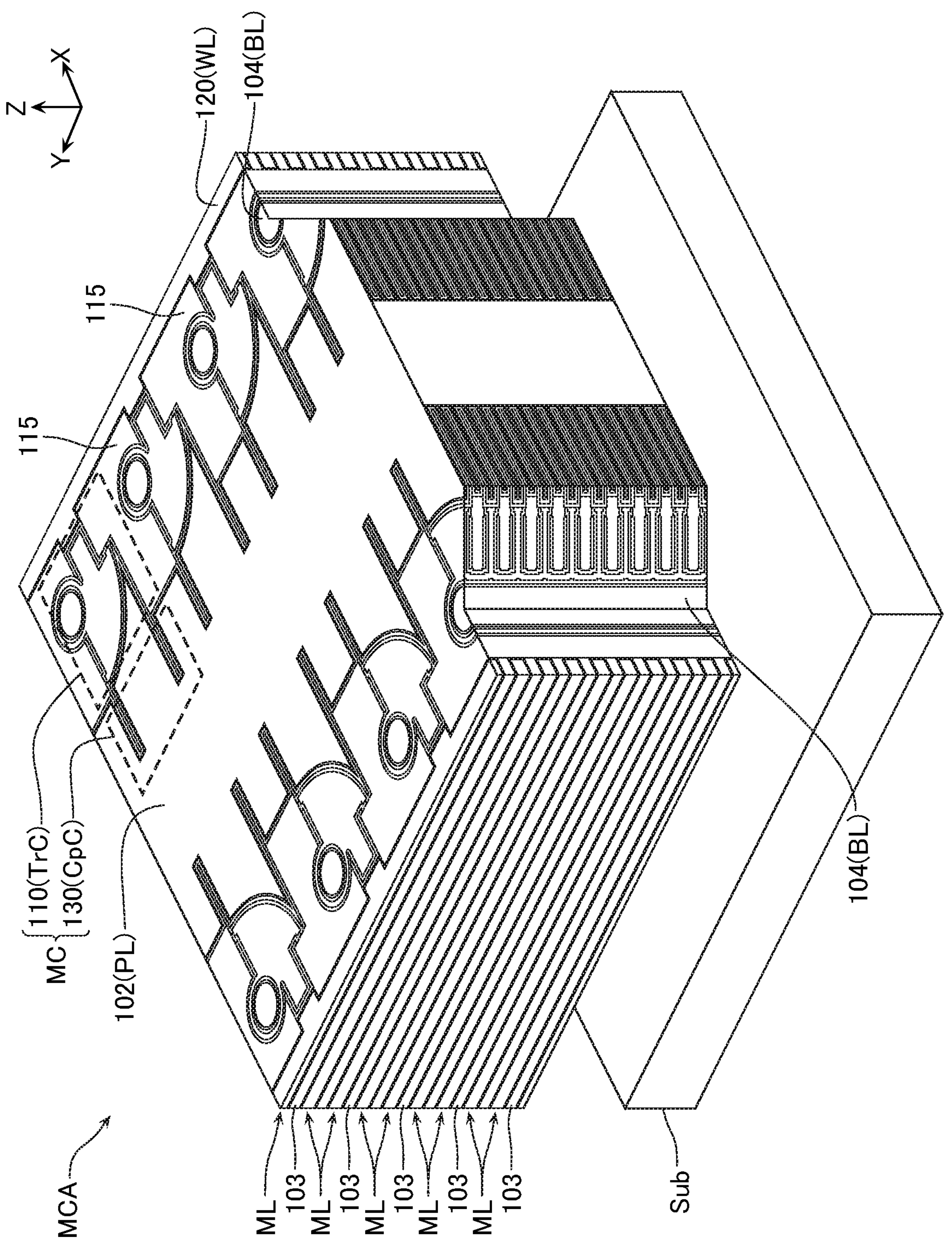
FIG. 2 is a schematic perspective view illustrating a configuration of a part of the semiconductor memory device.
Figure 3:
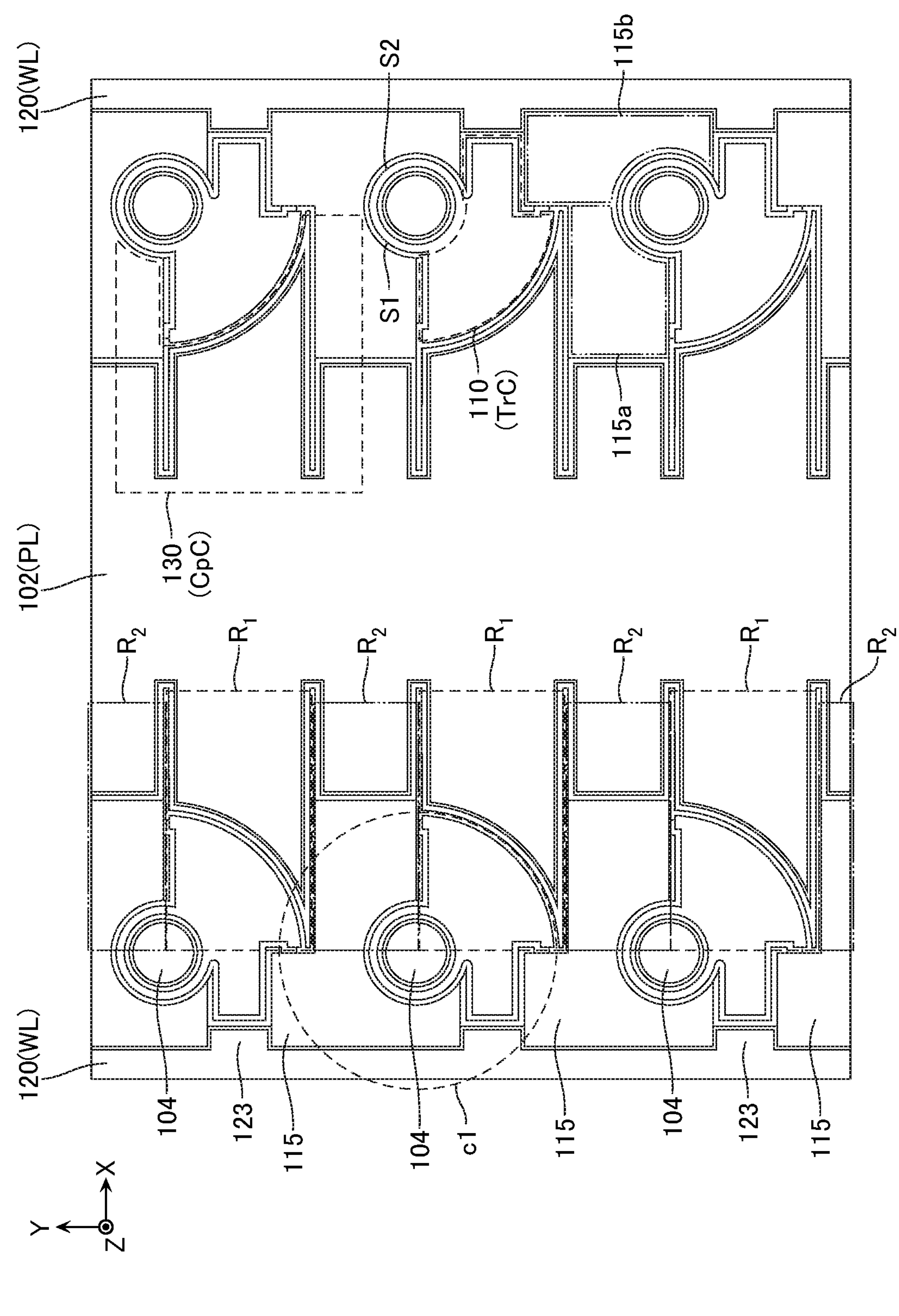
FIG. 3 is a schematic X-Y cross-sectional view illustrating a configuration of a part of the semiconductor memory device.
Figure 4:
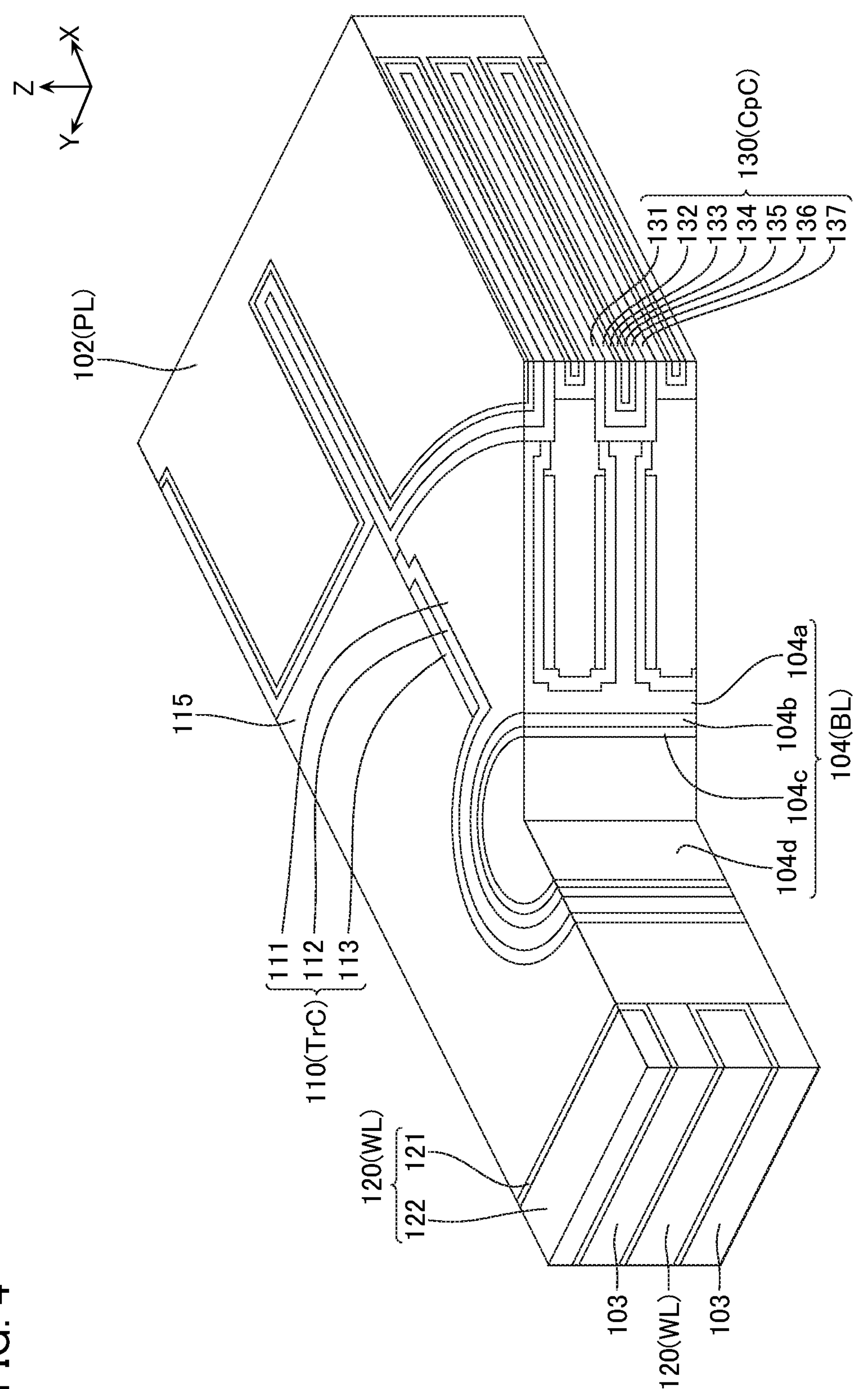
FIG. 4 is a schematic perspective view illustrating a configuration of a part of the semiconductor memory device.
Figure 5:
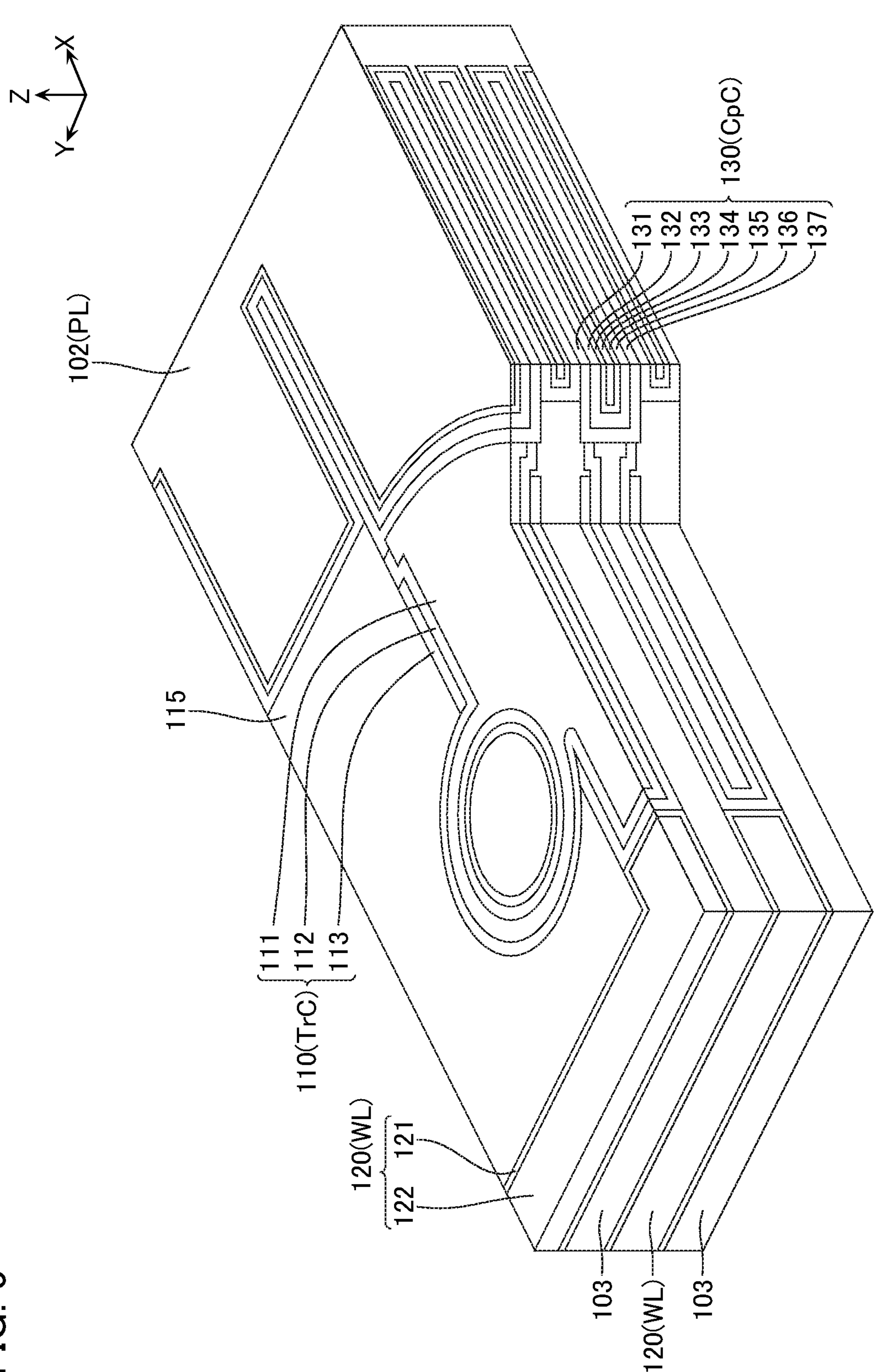
FIG. 5 is a schematic perspective view illustrating a configuration of a part of the semiconductor memory device.
Figures 6, 7:
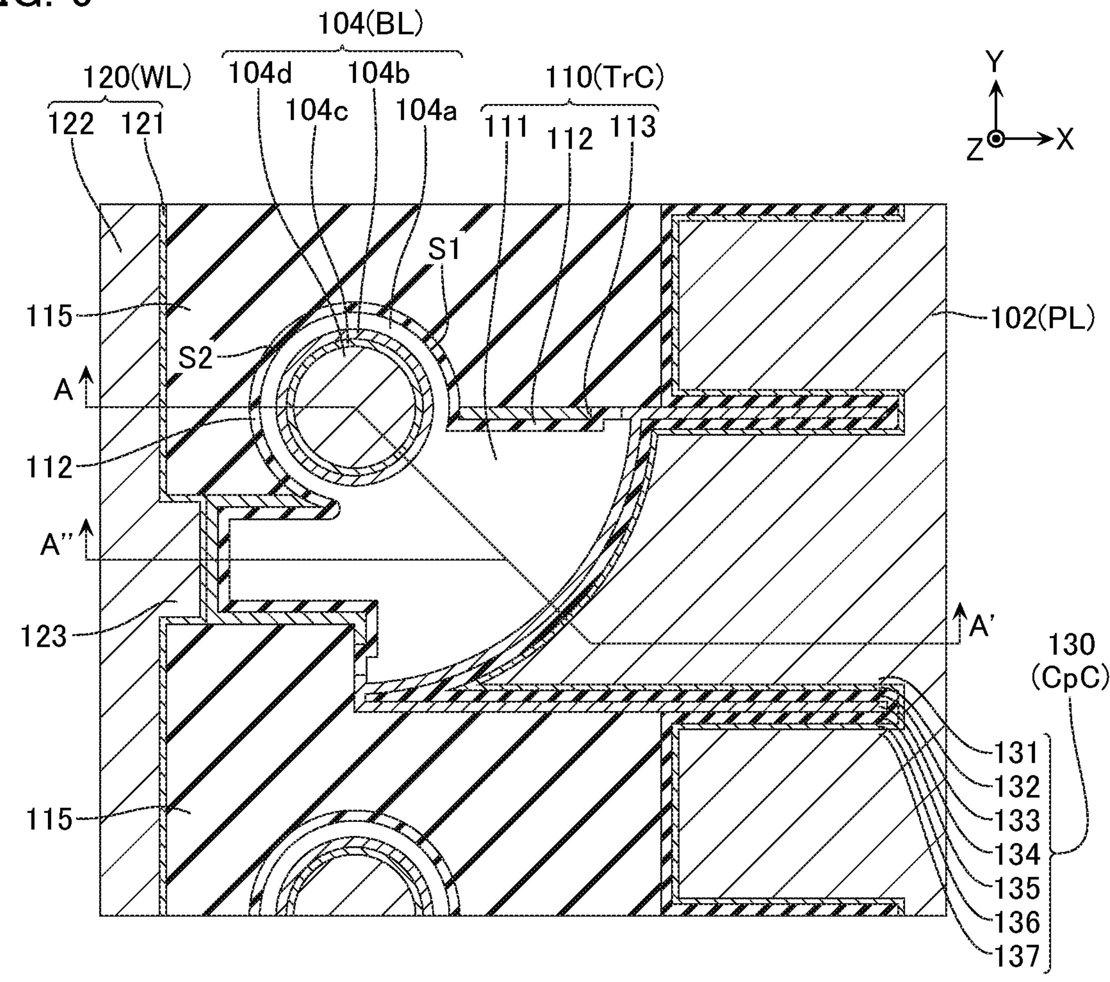
FIG. 6 is a schematic X-Y cross-sectional view illustrating a configuration of a part of the semiconductor memory device.
FIG. 7 is a schematic cross-sectional view illustrating a configuration of a part of the semiconductor memory device.
Figure 8:
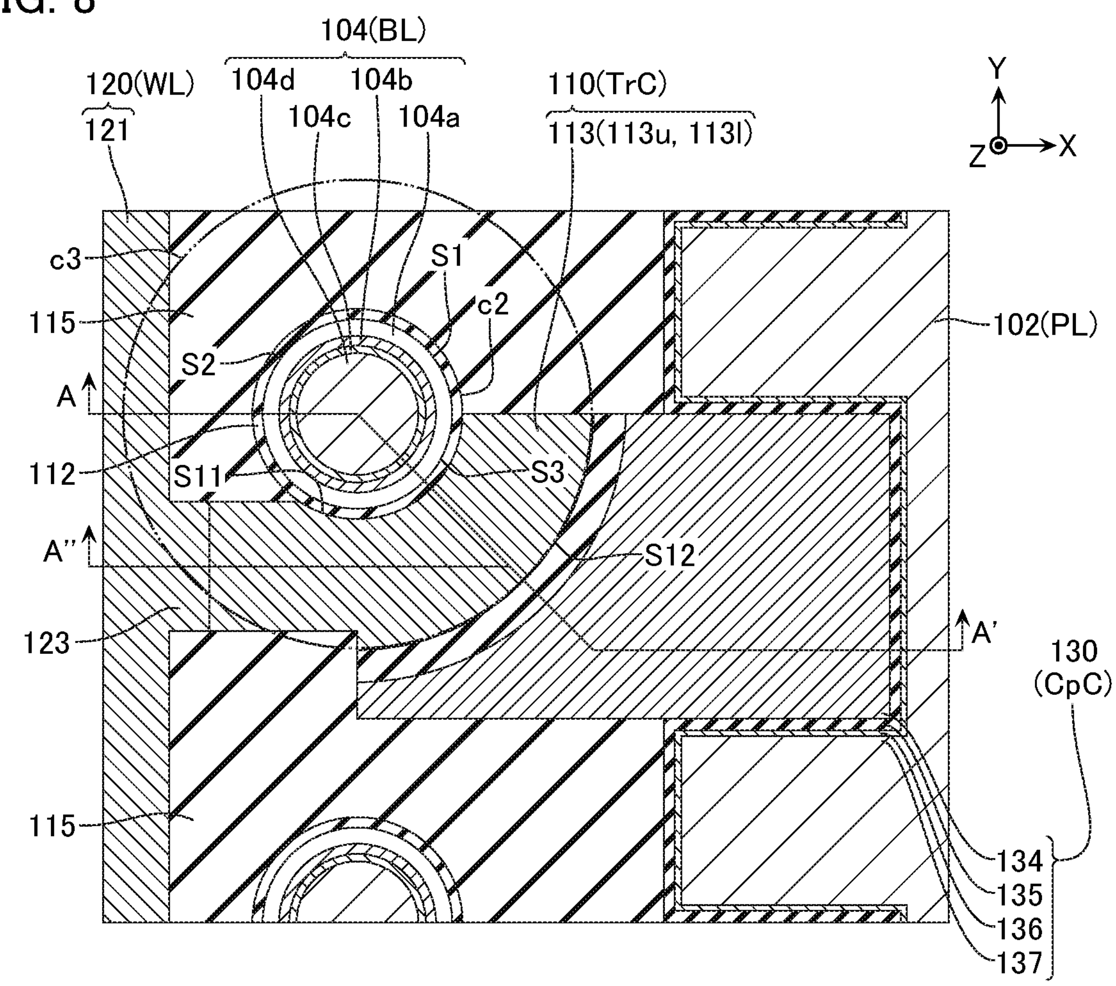
FIG. 8 is a schematic X-Y cross-sectional view illustrating a configuration of a part of the semiconductor memory device.
Figure 9:
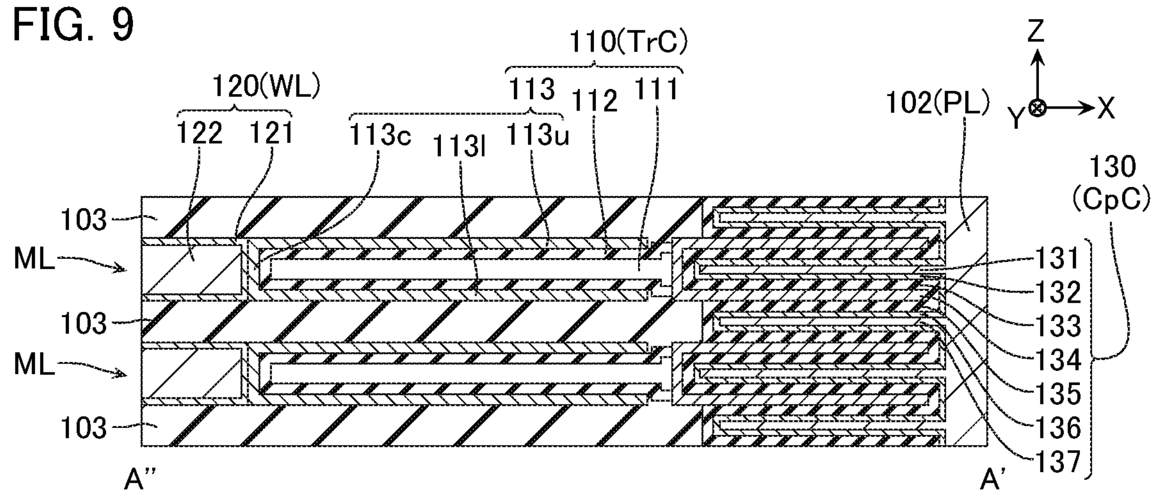
FIG. 9 is a schematic cross-sectional view illustrating a configuration of a part of the semiconductor memory device.

FIG. 2 is a schematic perspective view illustrating a configuration of a part of the semiconductor memory device according to the first embodiment. FIG. 3 is a schematic X-Y cross-sectional view illustrating a configuration of a part of the semiconductor memory device. FIG. 4 is a schematic perspective view illustrating a configuration of a part of the semiconductor memory device and illustrates an enlarged part of FIG. 2. FIG. 5 is a schematic perspective view illustrating a configuration of a part of the semiconductor memory device. FIG. 6 and FIG. 8 are schematic X-Y cross-sectional views illustrating configurations of parts of the semiconductor memory device. FIG. 6 illustrates an X-Y cross-sectional surface at a height position (a position in the Z-direction) corresponding to a semiconductor layer 111 described later. Additionally, FIG. 8 illustrates an X-Y cross-sectional surface at a height position (the position in the Z-direction) corresponding to a part 113*u* or a part 113*l* of a conductive layer 113 described later. FIG. 7 and FIG. 9 are schematic cross-sectional views illustrating configurations of parts of the semiconductor memory device. Note that FIG. 7 illustrates a configuration of the structure illustrated in FIG. 6 and FIG. 8 taken along the lines A-A' and viewed along the arrow direction, and corresponds to a drawing of viewing the configuration illustrated in FIG. 4 in a +Y-direction. FIG. 9 illustrates a configuration of the structure illustrated in FIG. 6 and FIG. 8 taken along the lines A"-A' and viewed along the arrow direction, and corresponds to a drawing of viewing the configuration illustrated in FIG. 5 in the +Y-direction.

FIG. 2 illustrates a part of a semiconductor substrate Sub and the memory cell array MCA disposed above the semiconductor substrate Sub.

The semiconductor substrate Sub is, for example, a semiconductor substrate of silicon (Si) or the like containing P-type impurities, such as boron (B). An insulating layer and an electrode layer (not illustrated) are disposed on an upper surface of the semiconductor substrate Sub. The upper surface of the semiconductor substrate Sub and the insulating layer and the electrode layer (not illustrated) constitute a control circuit for controlling the semiconductor memory device according to the first embodiment. For example, in a region immediately below the memory cell array MCA, a sense amplifier circuit is disposed. The sense amplifier circuit is electrically connected to the bit lines BL. The sense amplifier circuit can read data stored in the selected memory cell MC by detecting a voltage fluctuation or a current in the bit line BL in a read operation.

The memory cell array MCA includes the plurality of memory layers ML arranged in the Z-direction. Between the respective plurality of memory layers ML, insulating layers 103, such as silicon oxide ($SiO_2$), are disposed.

The memory cell array MC includes a conductive layer 102. The conductive layer 102 extends in the Y-direction and the Z-direction to separate the memory layer ML in the X-direction.

The conductive layer 102 includes, for example, a stacked structure of titanium nitride (TiN) and tungsten (W). The conductive layer 102 functions as, for example, the plate line PL (FIG. 1).

The memory cell array MCA includes a plurality of via-wirings 104 and a plurality of insulating layers 115 alternately arranged in the Y-direction. The plurality of via-wirings 104 and the plurality of insulating layers 115 are arranged in the Y-direction, pass through the plurality of memory layers ML, and extend in the Z-direction.

For example, as illustrated in FIG. 4, the via-wiring 104 includes a semiconductor film 104*a* containing a material similar to the semiconductor layer 111 described later, a conductive oxide film 104*b* containing a conductive oxide, a barrier conductive film 104*c*, such as titanium nitride (TiN), and a conductive member 104*d*, such as tungsten (W). Note that instead of the conductive oxide film 104*b*, the via-wiring 104 may contain any metal including ruthenium (Ru) and iridium (Ir). The via-wiring 104 may contain only the conductive oxide or may contain only any metal including ruthenium (Ru) and iridium (Ir).

Note that, in this specification, the "conductive oxide", for example, includes any conductive material containing oxygen including indium tin oxide (ITO), indium zinc oxide (IZO), ruthenium oxide ($RuO_2$), and iridium oxide ($IrO_2$).

The conductive member 104*d* has an approximately columnar shape extending in the Z-direction. The barrier conductive film 104*c* has an approximately cylindrical shape extending in the Z-direction along an outer peripheral surface of the conductive member 104*d*. The conductive oxide film 104*b* has an approximately cylindrical shape extending in the Z-direction along an outer peripheral surface of the barrier conductive film 104*c*. The semiconductor film 104*a* has an approximately cylindrical shape extending in the Z-direction along an outer peripheral surface of the conductive oxide film 104*b*. On an outer peripheral surface of the semiconductor film 104*a*, a part of an insulating layer 112 described later is disposed. The via-wiring 104 functions as, for example, the bit line BL (FIG. 1). The plurality of bit lines BL are, for example, as illustrated in FIG. 2, disposed corresponding to the plurality of transistors TrC included in the memory layer ML.

The insulating layer 115, for example, contains silicon oxide ($SiO_2$) or the like.

As illustrated in FIG. 3, the memory layer ML includes a plurality of approximately rectangular regions $R_1$ arranged in the Y-direction corresponding to the plurality of via-wirings 104 and a plurality of approximately rectangular regions $R_2$ alternately arranged with these plurality of regions $R_1$ in the Y-direction. End portions of these plurality of regions $R_1$, $R_2$ on one side in the X-direction reach the plurality of via-wirings 104 arranged in the Y-direction. Additionally, end portions of these plurality of regions $R_1$, $R_2$ on the other side in the X-direction reach the conductive layer 102. A transistor structure 110 is disposed in a region inside an imaginary circle c1 around a center point of the via-wiring 104 in the region $R_1$. Additionally, a part of a capacitor structure 130 is disposed in a region outside the circle c1 in the region $R_1$. Each of the regions $R_2$ includes parts of two of the capacitor structures 130 adjacent in the Y-direction and a part 115*a* of the insulating layer 115. The capacitor structure 130 is disposed on a conductive layer 102 side with respect to the transistor structure 110.

The memory layer ML includes a conductive layer 120 disposed on a side opposite to the conductive layer 102 with respect to these plurality of regions $R_1$, $R_2$. The conductive layer 120 extends in the Y-direction. On a side surface of the conductive layer 120 on a via-wiring 104 side in the X-direction, a plurality of projecting portions 123 are disposed corresponding to the plurality of regions $R_1$ arranged in the Y-direction. The via-wiring 104 is spaced from the projecting portion 123.

The memory layer ML includes parts 115*b* of the insulating layers 115 disposed between the plurality of regions $R_2$ arranged in the Y-direction and the conductive layer 120 and arranged in the Y-direction corresponding to the plurality of regions $R_2$.

In the illustrated example, a width of the part 115*b* of the insulating layer 115 in the Y-direction is larger than a width of the part 115*a* of the insulating layer 115 in the Y-direction. A side surface of the part 115*b* on a Y-direction positive side is disposed on the Y-direction positive side with respect to a side surface of the part 115*a* on the Y-direction positive side. Similarly, a side surface of the part 115*b* on a Y-direction negative side is disposed on the Y-direction negative side with respect to a side surface of the part 115*a* on the Y-direction negative side.

In the illustrated example, an outer peripheral surface of the via-wiring 104 includes a surface S1 and a surface S2. The surface S1 is in contact with the part 115*a* via the insulating layer 112 (The surface S1 is opposed to the part 115*a* via the insulating layer 112) over a degree range of approximately 90°. The surface S2 is in contact with the part 115*b* via the insulating layer 112 (The surface S2 is opposed to the part 115*b* via the insulating layer 112) over a degree range of 180°. In the X-Y cross-sectional surface exemplified in FIG. 8, a surface S3 is disposed in the remaining degree range of approximately 90°. The surface S3 is in contact with the conductive layer 113 described later via the insulating layer 112 (The surface S3 is opposed to the conductive layer 113 described later via the insulating layer 112). In the X-Y cross-sectional surface exemplified in FIG. 6, the semiconductor film 104*a* in the via-wiring 104 is continuous with the semiconductor layer 111 in the remaining degree range of approximately 90°.

Configuration of Transistor Structure 110

For example, as illustrated in FIG. 6 and FIG. 7, the transistor structure 110 includes the semiconductor layer 111, the insulating layer 112 disposed on an upper surface, a lower surface, and side surfaces of the semiconductor layer 111, and the conductive layer 113 disposed on an upper surface, a lower surface, and side surfaces of the insulating layer 112. The semiconductor layer 111, the insulating layer 112, and the conductive layer 113 have an approximately fan shape (circular-sector shape) including an arc-shaped side surface extending along the outer peripheral surface of the via-wiring 104, a side surface in the Y-direction extending in the X-direction along a boundary of the region $R_1$ in the Y-direction, and an arc-shaped side surface extending along the circle c1 (FIG. 3).

The semiconductor layer 111 function as, for example, a channel region of the transistor TrC (FIG. 1). The semiconductor layer 111 may be, for example, a semiconductor containing at least one element of gallium (Ga) and aluminum (Al), and containing indium (In), zinc (Zn), and oxygen (O), or may be another oxide semiconductor. The semiconductor layer 111 has the approximately fan shape as illustrated in FIG. 6 as described above. Note that a part of the semiconductor layer 111 is disposed on a capacitor structure 130 side in FIG. 6 (the right side in the example of FIG. 6) with respect to the via-wiring 104 in the X-direction.

The insulating layer 112 functions as, for example, a gate insulating film of the transistor TrC (FIG. 1). The insulating layer 112, for example, contains silicon oxide ($SiO_2$) or the like. Note that a part of the insulating layer 112 is disposed on the capacitor structure 130 side in FIG. 6 (the right side in the example of FIG. 6) with respect to the via-wiring 104 in the X-direction.

The conductive layer 113 functions as, for example, the gate electrode of the transistor TrC (FIG. 1). The conductive layer 113, for example, contains a conductive oxide, such as titanium nitride (TiN) and indium tin oxide (ITO). Note that a part of the conductive layer 113 is disposed on the capacitor structure 130 side in FIG. 8 (the right side in the example of FIG. 8) with respect to the via-wiring 104 in the X-direction.

In the cross-sectional surface illustrated in FIG. 8, the conductive layer 113 has an approximately fan shape. For example, the conductive layer 113 includes a surface S11 and a surface S12. The surface S11 is in contact with the via-wiring 104 via the insulating layer 112 (The surface S11 is opposed to the via-wiring 104 via the insulating layer 112). The surface S11 is a curved surface along an imaginary circle c2 around the center point of the via-wiring 104 (in the illustrated example, the circle c2 corresponds to an outer peripheral surface of a part covering the outer peripheral surface of the via-wiring 104 of the insulating layer 112). The surface S12 is in contact with the capacitor structure 130 via the insulating layer 112 (The surface S12 is opposed to the capacitor structure 130 via the insulating layer 112). The surface S12 is a curved surface along an imaginary circle c3 around a center point of the via-wiring 104. The circle c3 has a radius larger than a radius of the circle c2.

Note that FIG. 9 notates a part of the conductive layer 113 covering an upper surface of the semiconductor layer 111 as the part 113*u* and a part of the conductive layer 113 covering a lower surface of the semiconductor layer 111 as the part 113*l*. A part of the conductive layer 113 disposed between the part 113*u* and the part 113*l* is notated as a part 113*c*. The part 113*c*, which extends in the Z-direction, has an upper end continuous with the part 113*u* and has a lower end continuous with the part 113*l*. The part 113*c* is in contact with a side surface of the conductive layer 120 in the X-direction.

Configuration of Conductive Layer 120

The conductive layer 120 functions as, for example, the word line WL (FIG. 1). The conductive layer 120 extends in the Y-direction and is connected to the plurality of conductive layers 113 arranged in the Y-direction. The conductive layer 120, for example, includes a barrier conductive film 121, such as titanium nitride (TiN), and a conductive film 122 of tungsten (W).

In the illustrated example, a distance between the conductive layer 120 and the via-wiring 104 is larger than a distance between the conductive layer 113 and the via-wiring 104 (a thickness of the insulating layer 112).

Configuration of Capacitor Structure 130

For example, as illustrated in FIG. 6 and FIG. 7, the capacitor structure 130 includes a conductive layer 131, a conductive layer 132 disposed on an upper surface, a lower surface, and side surfaces of the conductive layer 131, an insulating layer 133 disposed on an upper surface, a lower surface, and side surfaces of the conductive layer 132, a conductive layer 134 disposed on an upper surface, a lower surface, and side surfaces of the insulating layer 133, an insulating layer 135 disposed on an upper surface, a lower surface, and side surfaces of the conductive layer 134, a conductive layer 136 disposed on an upper surface, a lower surface, and side surfaces of the insulating layer 135, and a conductive layer 137 disposed on an upper surface, a lower surface, and side surfaces of the conductive layer 136.

The conductive layers 131, 132, 136, 137 function as one electrodes of the capacitors CpC (FIG. 1). The conductive layers 131, 137, for example, contain tungsten (W) or the like and are continuous with a part of tungsten in the conductive layer 102. The conductive layers 132, 136, for example, contain titanium nitride (TiN) or the like and are continuous with a part of titanium nitride in the conductive layer 102.

The insulating layers 133, 135 function as insulating layers of the capacitors CpC (FIG. 1). The insulating layers 133, 135, for example, may be zirconia ($ZrO_2$), alumina ($Al_2O_3$), or another insulating metal oxide. The insulating layers 133, 135, for example, may be a stacked film of a plurality of insulating metal oxides (for example, a stacked film of zirconia and alumina).

The conductive layer 134 functions as, for example, the other electrode of the capacitor CpC (FIG. 1). The conductive layer 134, for example, contains indium tin oxide (ITO) or the like. The conductive layer 134 is insulated from the conductive layers 131, 132, 136, 137 via the insulating layers 133, 135. The conductive layer 134 is connected to a side surface of the semiconductor layer 111 in the X-direction.

Manufacturing Method

Figure 10:
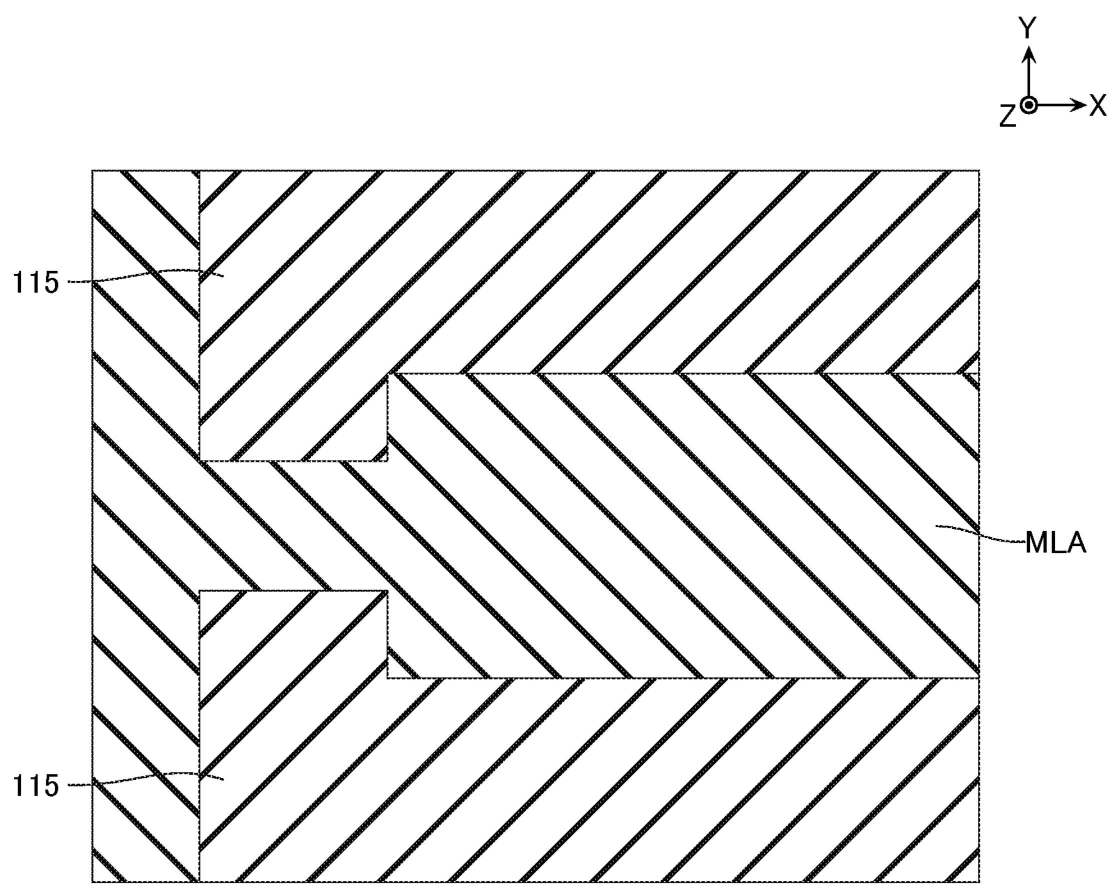
FIG. 10 is a schematic cross-sectional view for describing a manufacturing method of the semiconductor memory device.
Figure 62:
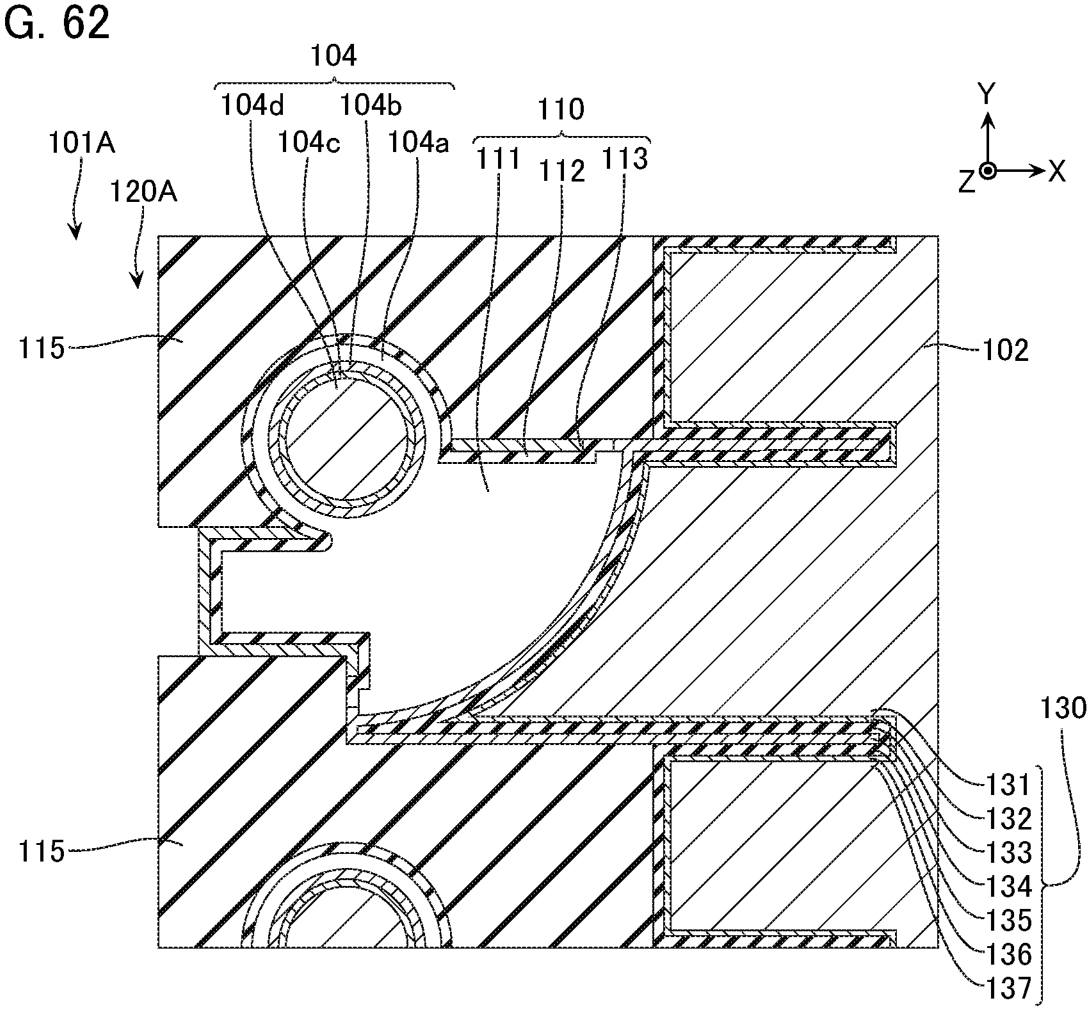
FIG. 62 is a schematic cross-sectional view for describing the manufacturing method.
Figure 63:
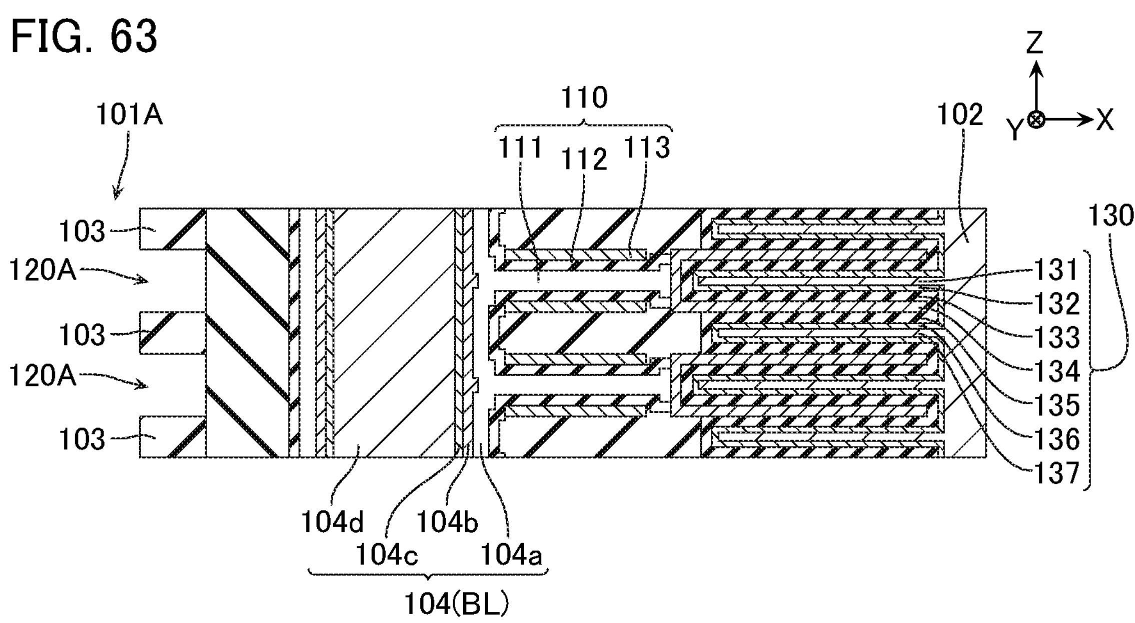
FIG. 63 is a schematic cross-sectional view for describing the manufacturing method.

FIG. 10 to FIG. 63 are schematic cross-sectional views for describing the manufacturing method of the semiconductor memory device according to the first embodiment. FIG. 10, FIG. 12, FIG. 14, FIG. 16, FIG. 18, FIG. 20, FIG. 22, FIG. 24, FIG. 26, FIG. 28, FIG. 30, FIG. 32, FIG. 34, FIG. 36, FIG. 38, FIG. 40, FIG. 42, FIG. 44, FIG. 46, FIG. 48, FIG. 50, FIG. 52, FIG. 54, FIG. 56, FIG. 58, FIG. 60, and FIG. 62 illustrate cross-sectional surfaces corresponding to FIG. 6. FIG. 11, FIG. 13, FIG. 15, FIG. 17, FIG. 19, FIG. 21, FIG. 23, FIG. 25, FIG. 27, FIG. 29, FIG. 31, FIG. 33, FIG. 35, FIG. 37, FIG. 39, FIG. 41, FIG. 43, FIG. 45, FIG. 47, FIG. 49, FIG. 51, FIG. 53, FIG. 55, FIG. 57, FIG. 59, FIG. 61, and FIG. 63 illustrate cross-sectional surfaces corresponding to FIG. 7.

Figure 11:
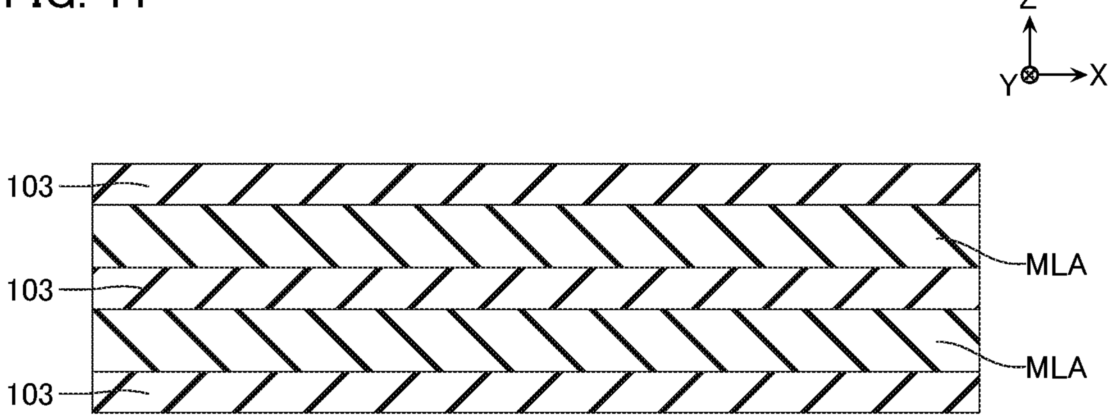
FIG. 11 is a schematic cross-sectional view for describing the manufacturing method.

In the manufacturing method, for example, as illustrated in FIG. 11, the plurality of insulating layers 103 and a plurality of sacrifice layers MLA are alternately formed. The sacrifice layer MLA, for example, contains silicon nitride ($Si_3N_4$) and the like. This process is, for example, performed by Chemical Vapor Deposition (CVD) or the like.

Next, for example, as illustrated in FIG. 10, the insulating layers 115 are formed. In this process, for example, an opening is formed at a position corresponding to the insulating layer 115. This opening extends in the Z-direction and passes through the plurality of insulating layers 103 and the plurality of sacrifice layers MLA arranged in the Z-direction. This process is, for example, performed by RIE or the like. After forming the opening, the insulating layer 115 is formed. This process is, for example, performed by CVD or the like.

Figures 12, 13:
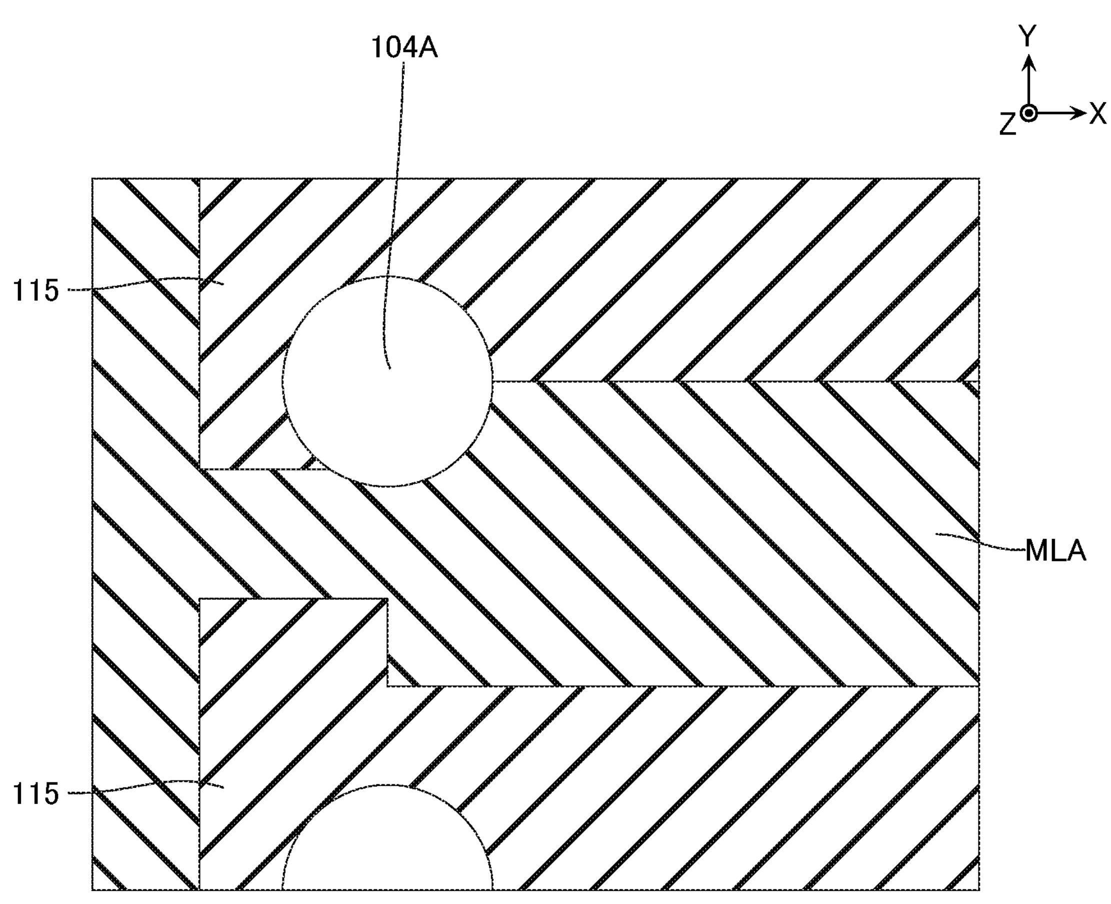
FIG. 12 is a schematic cross-sectional view for describing the manufacturing method.
FIG. 13 is a schematic cross-sectional view for describing the manufacturing method.

Next, for example, as illustrated in FIG. 12 and FIG. 13, an opening 104A is formed at positions corresponding to the via-wirings 104. The opening 104A extends in the Z-direction as illustrated in FIG. 13. A part of the opening 104A passes through the plurality of insulating layers 103 and the plurality of sacrifice layers MLA arranged in the Z-direction. Another part of the opening 104A passes through the insulating layer 115. This process is, for example, performed by RIE or the like. Note that while the illustration is omitted, after forming the opening 104A, an upper portion of the opening 104A is obstructed by an insulating layer or the like.

In the embodiment, the opening 104A is formed at a boundary position of the insulating layer 115 and the plurality of insulating layers 103 and the plurality of sacrifice layers MLA arranged in the Z-direction. Therefore, when an X-Y cross-sectional surface including the sacrifice layers MLA is observed, as illustrated in FIG. 12, the sacrifice layer MLA is exposed to a part of an inner peripheral surface of the opening 104A and the insulating layer 115 is exposed to the other part of the inner peripheral surface of the opening 104A. Although the illustration is omitted, when an X-Y cross-sectional surface including the insulating layer 103 is observed, the insulating layer 103 is exposed to a part of the inner peripheral surface of the opening 104A and the insulating layer 115 is exposed to the other part of the inner peripheral surface of the opening 104A.

Figures 14, 15:
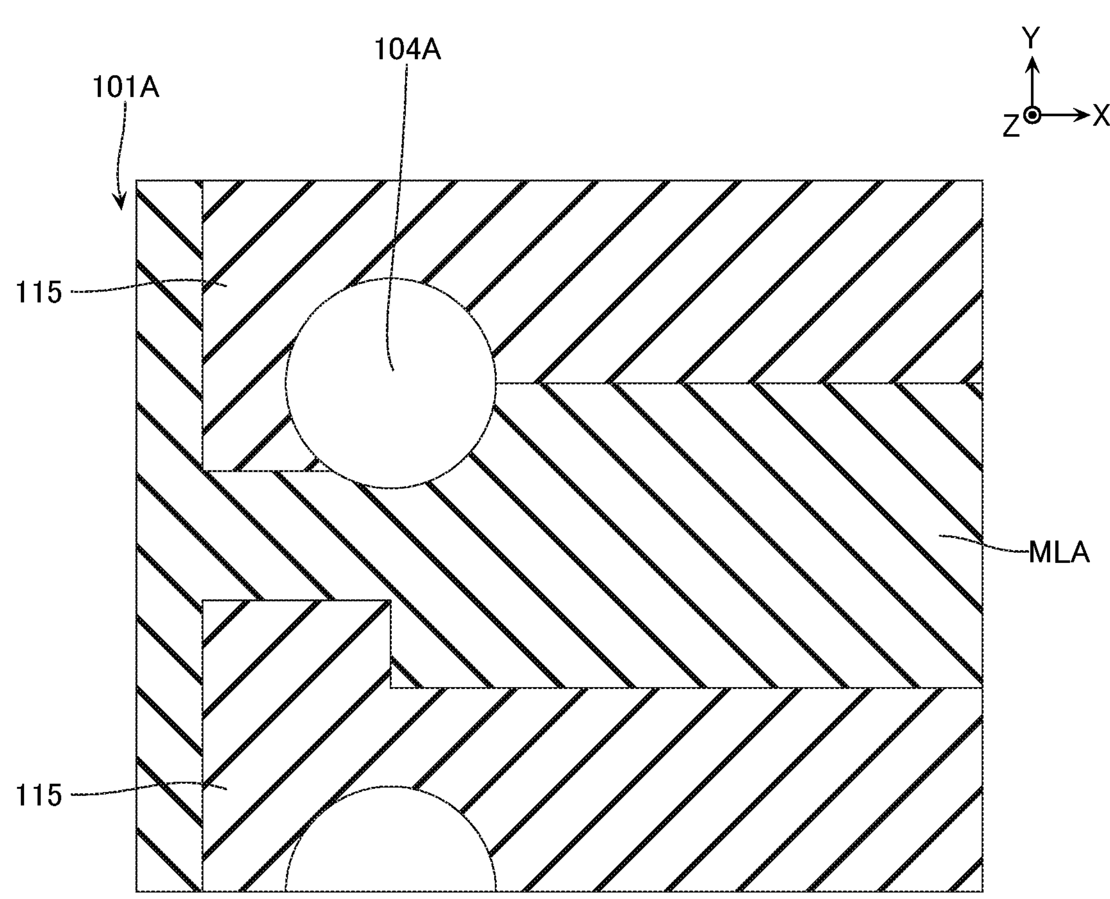
FIG. 14 is a schematic cross-sectional view for describing the manufacturing method.
FIG. 15 is a schematic cross-sectional view for describing the manufacturing method.

Next, for example, as illustrated in FIG. 14 and FIG. 15, an opening 101A is formed at a proximity of a position corresponding to the conductive layer 120. The opening 101A extends in the Y-direction and the Z-direction, passes through the plurality of insulating layers 103 and the plurality of sacrifice layers MLA arranged in the Z-direction, and separate these configurations in the X-direction. This process is, for example, performed by RIE or the like.

Figure 16:
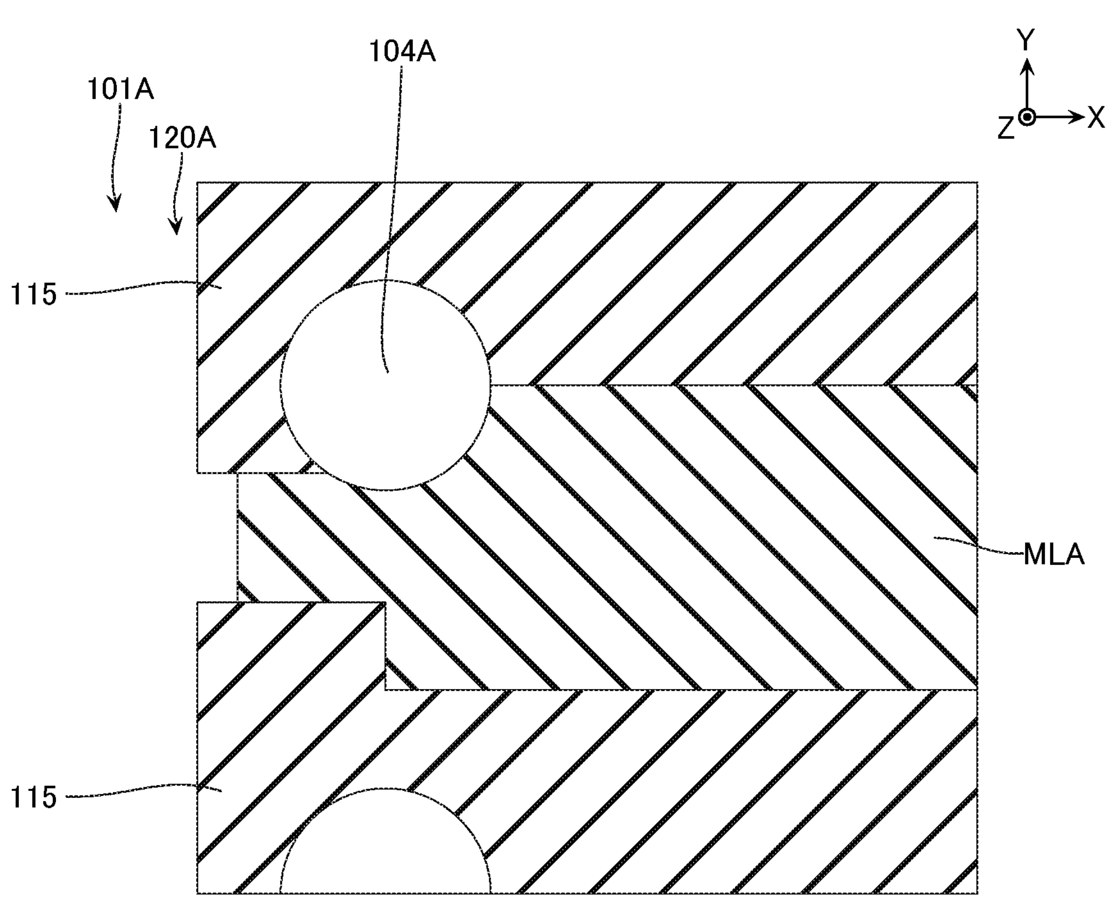
FIG. 16 is a schematic cross-sectional view for describing the manufacturing method.
Figure 17:
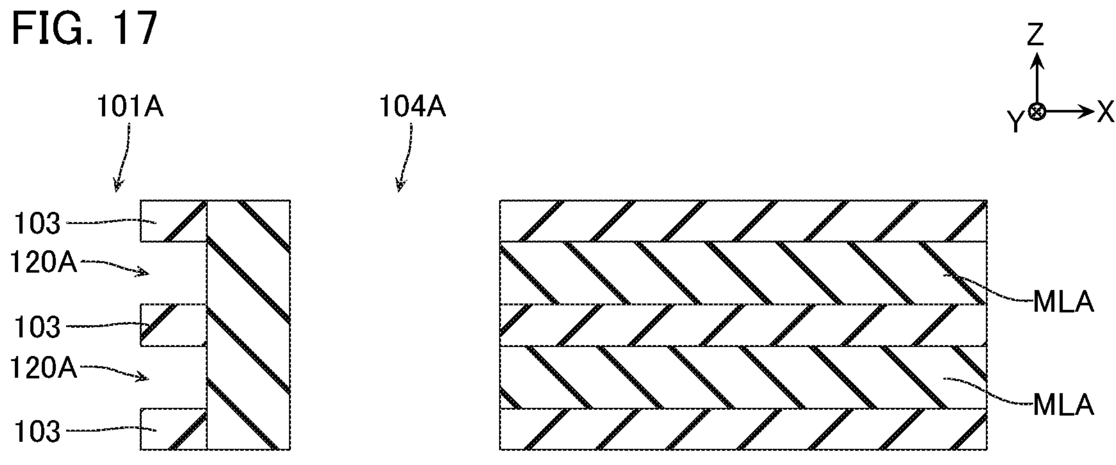
FIG. 17 is a schematic cross-sectional view for describing the manufacturing method.

Next, for example, as illustrated in FIG. 16 and FIG. 17, an opening 120A is formed at a position corresponding to the conductive layer 120. To an inside of the opening 120A, a part of an upper surface and a part of a lower surface of the insulating layer 103 and a part of a side surface of the sacrifice layer MLA in the X-direction are exposed. In this process, for example, via the opening 101A, a part of the sacrifice layer MLA is selectively removed. This process is, for example, performed by wet etching or the like. Note that the opening 120A does not communicate with the opening 104A.

Figures 18, 19:
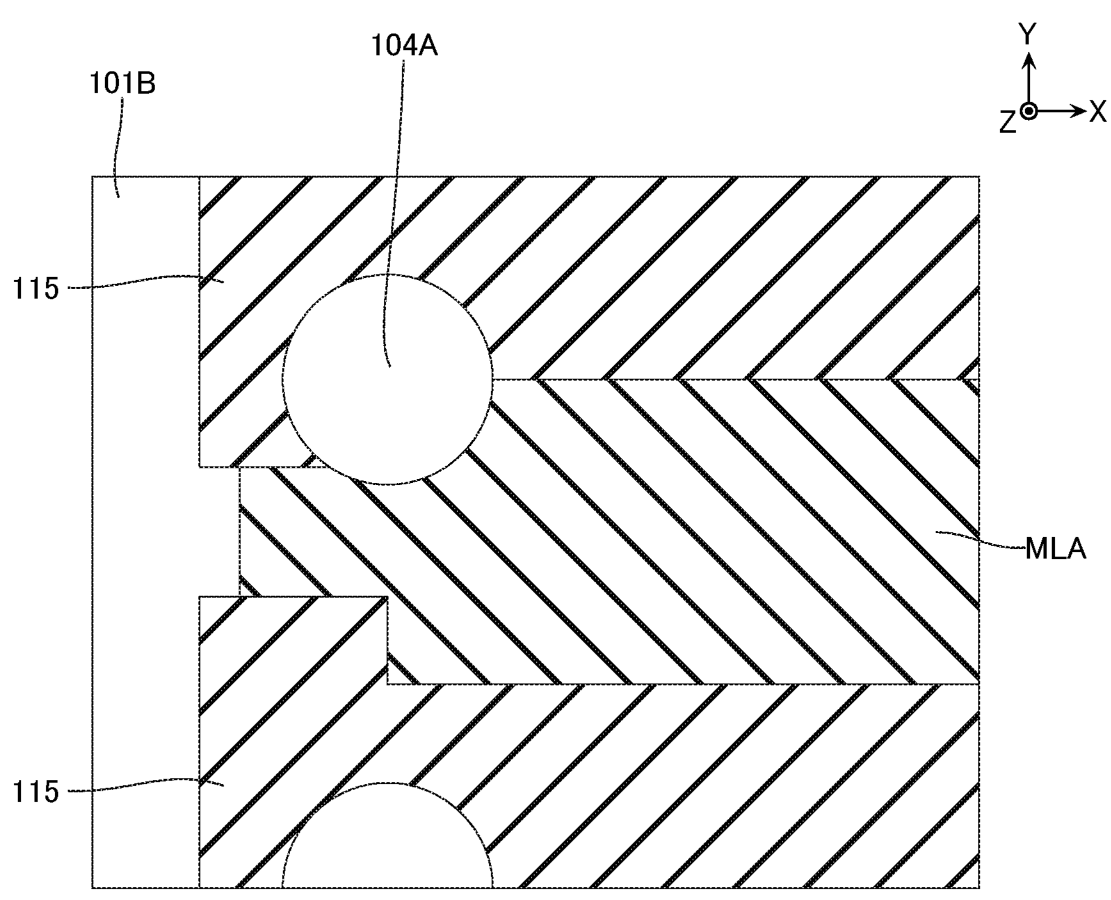
FIG. 18 is a schematic cross-sectional view for describing the manufacturing method.
FIG. 19 is a schematic cross-sectional view for describing the manufacturing method.

Next, for example, as illustrated in FIG. 18 and FIG. 19, a sacrifice layer 101B, such as silicon (Si), is embedded into the opening 101A and the opening 120A. This process is, for example, performed by CVD or the like.

Figures 20, 21:
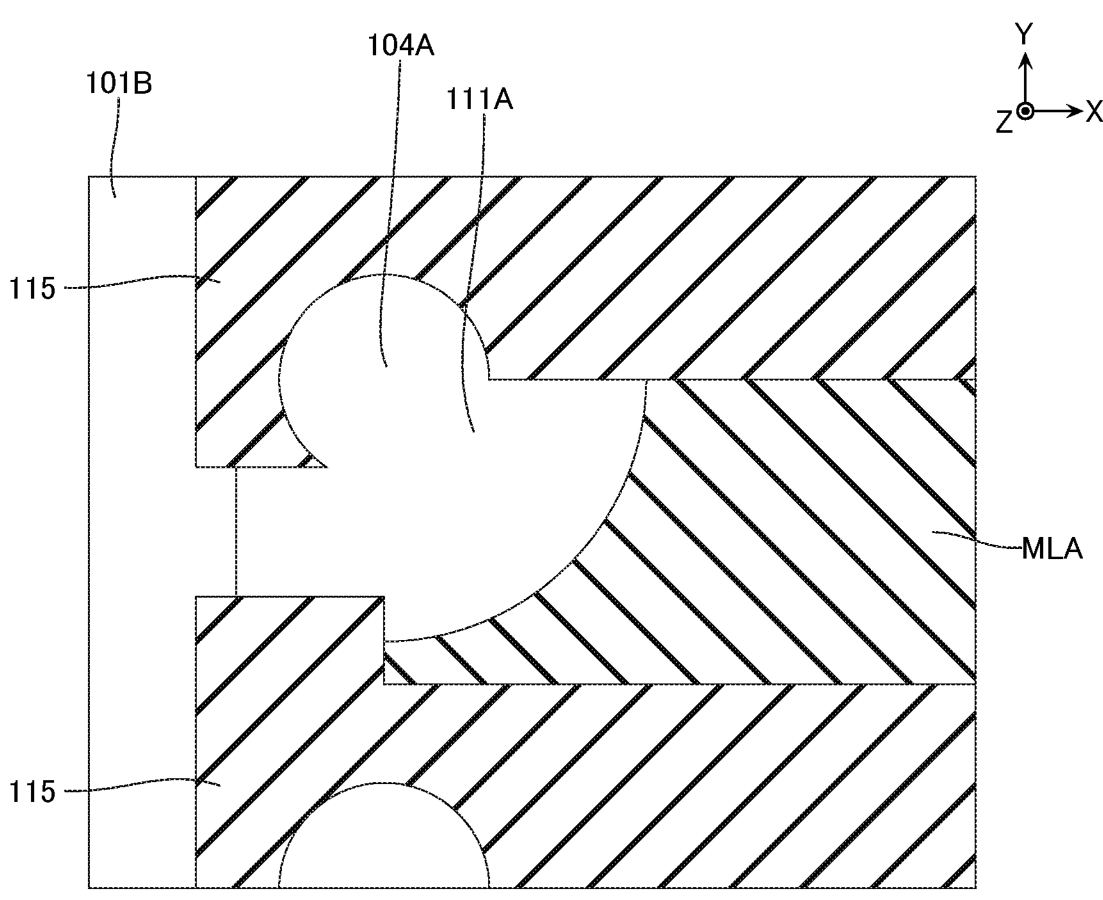
FIG. 20 is a schematic cross-sectional view for describing the manufacturing method.
FIG. 21 is a schematic cross-sectional view for describing the manufacturing method.

Next, for example, as illustrated in FIG. 20 and FIG. 21, an opening 111A is formed at a position corresponding to the semiconductor layer 111. To an inside of the opening 111A, a part of the upper surface and a part of the lower surface of the insulating layer 103, a part of the side surface of the sacrifice layer MLA in the X-direction, a part of a side surface of the insulating layer 115, and a part of the side surface of the sacrifice layer 101B in the X-direction are exposed. In this process, for example, a part of the sacrifice layer MLA is selectively removed via the opening 104A. This process is, for example, performed by wet etching or the like.

Here, in this process, the sacrifice layer MLA is removed from a position close to the opening 104A. In an example of FIG. 20, the opening 104A has a circular shape in an X-Y cross-sectional surface, and a circular region not including the sacrifice layer MLA expands around a center point of the opening 104A. In this process, to an inside of the opening 104A, parts of the two insulating layers 115 adjacent in the Y-direction are exposed.

Figure 22:
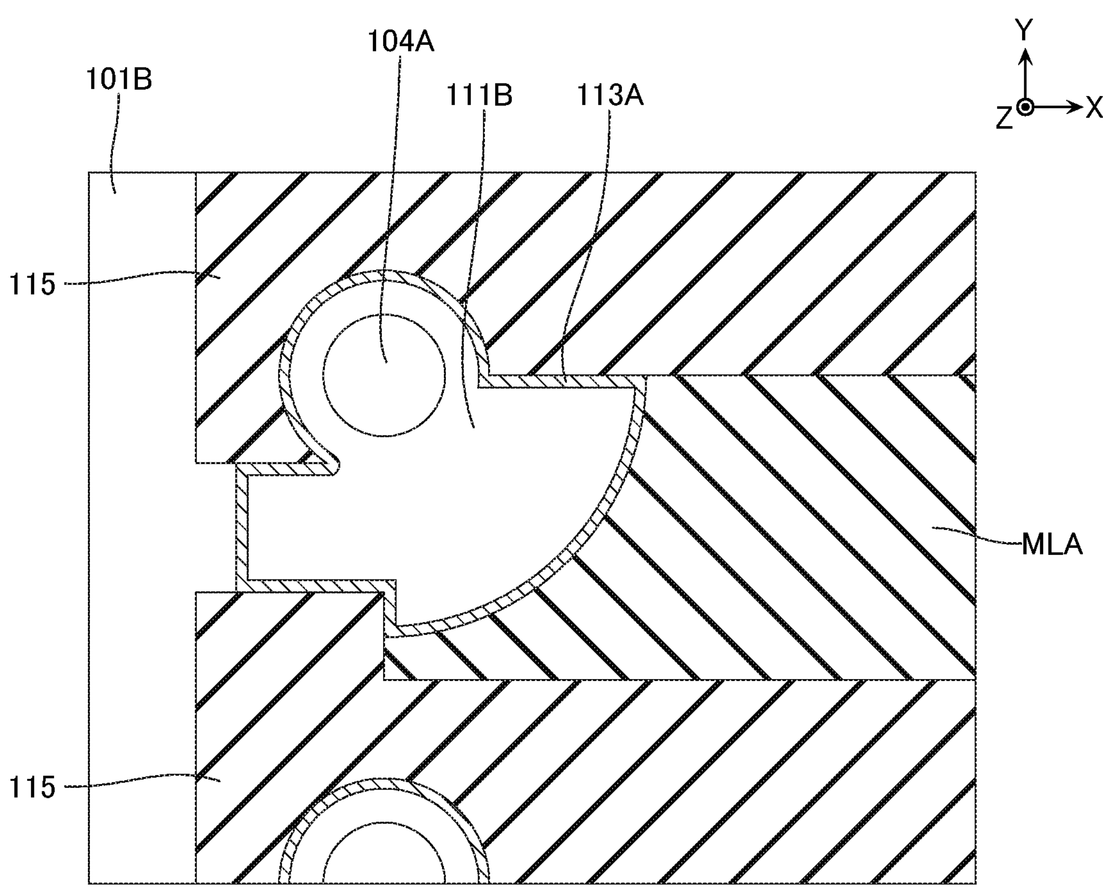
FIG. 22 is a schematic cross-sectional view for describing the manufacturing method.
Figure 23:
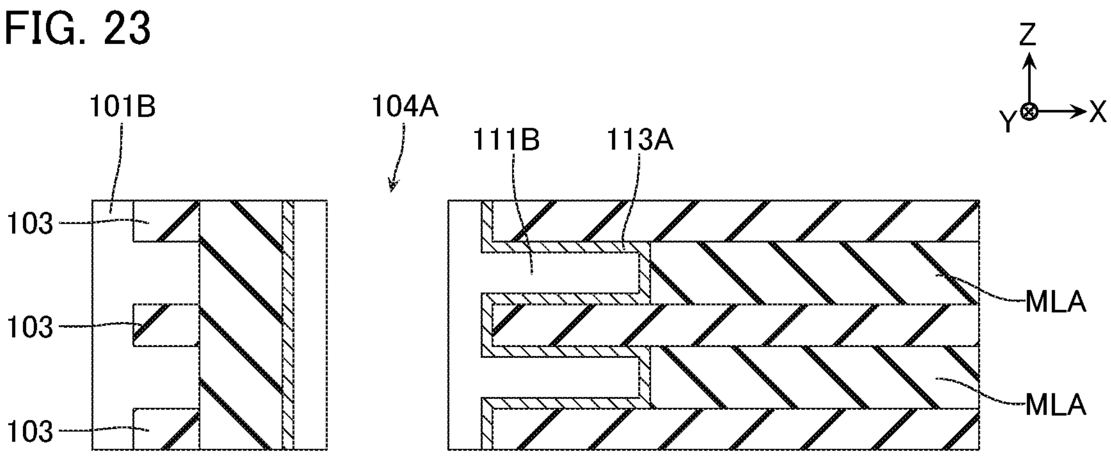
FIG. 23 is a schematic cross-sectional view for describing the manufacturing method.

Next, for example, as illustrated in FIG. 22 and FIG. 23, a conductive layer 113A and a sacrifice layer 111B, such as silicon (Si), are formed on the insides of the opening 111A and the opening 104A. The conductive layer 113A is formed on a part of the upper surface, a part of the lower surface, and an exposed surface to the opening 104A of the insulating layer 103, a part of the side surface of the sacrifice layer MLA in the X-direction, a part of the side surface of the insulating layer 115, and a part of a side surface of the sacrifice layer 101B in the X-direction. The opening 111A is embedded with the sacrifice layer 111B and the opening 104A is not embedded with the sacrifice layer 111B. This process is, for example, performed by CVD or the like. Note that while the illustration is omitted, after forming the conductive layer 113A and the sacrifice layer 111B, the upper portion of the opening 104A is obstructed by the insulating layer or the like.

Figure 24:
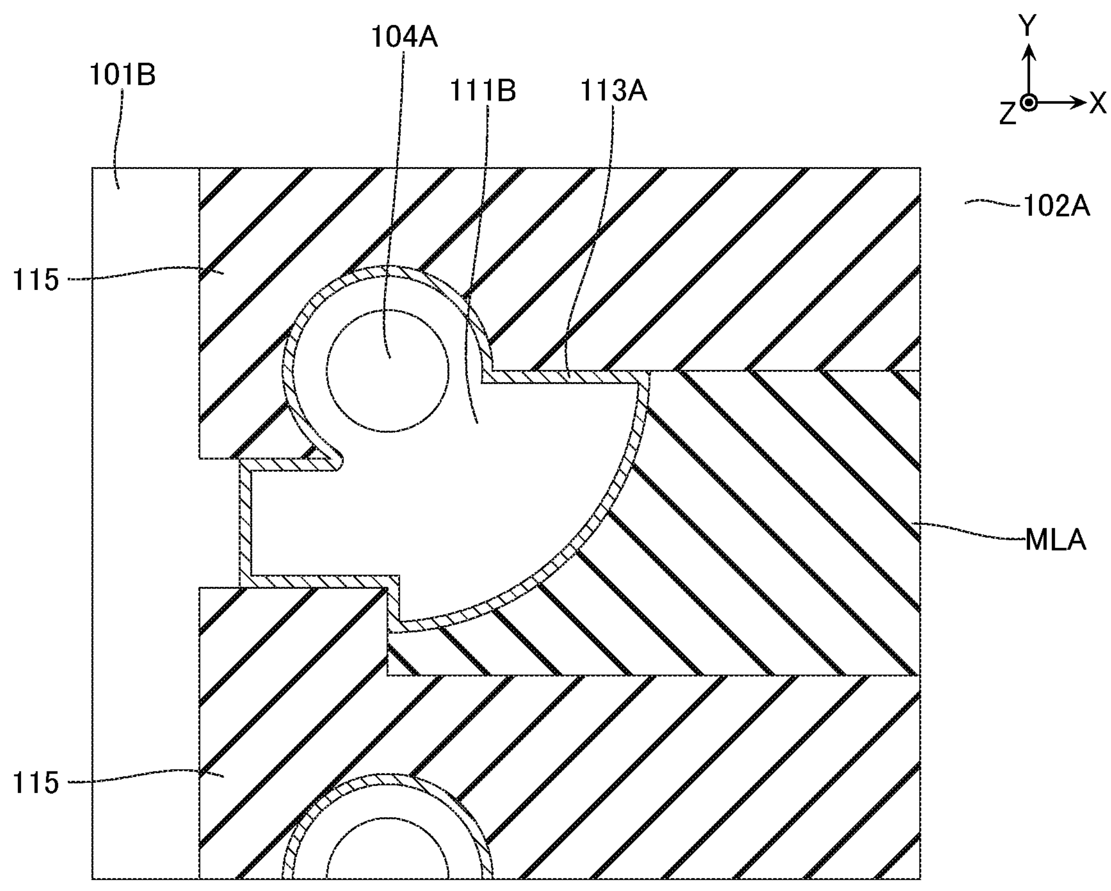
FIG. 24 is a schematic cross-sectional view for describing the manufacturing method.
Figure 25:
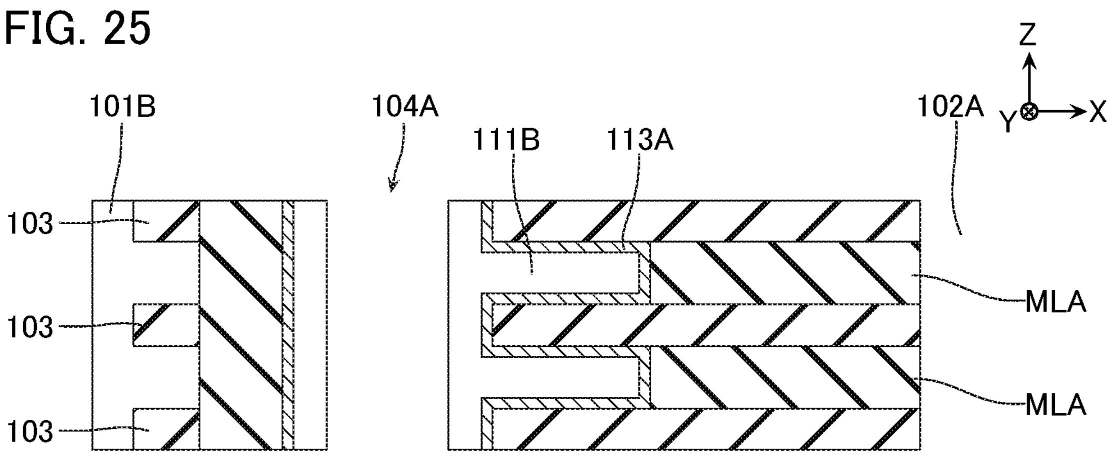
FIG. 25 is a schematic cross-sectional view for describing the manufacturing method.

Next, for example, as illustrated in FIG. 24 and FIG. 25, an opening 102A is formed at a position corresponding to the conductive layer 102. The opening 102A extends in the Y-direction and the Z-direction, passes through the plurality of insulating layers 103 and the plurality of sacrifice layers MLA arranged in the Z-direction, and the insulating layer 115, and separates these configurations in the X-direction. This process is, for example, performed by RIE or the like.

Figure 26:
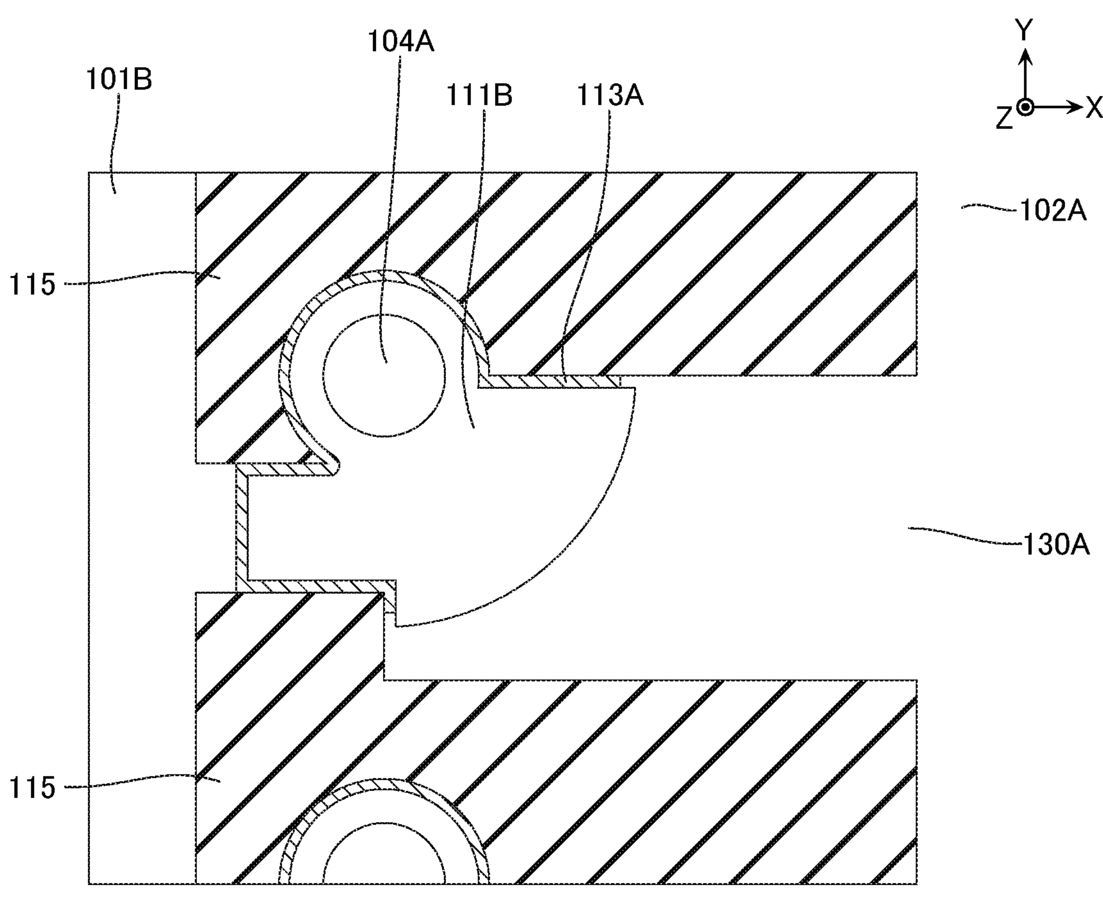
FIG. 26 is a schematic cross-sectional view for describing the manufacturing method.
Figure 27:
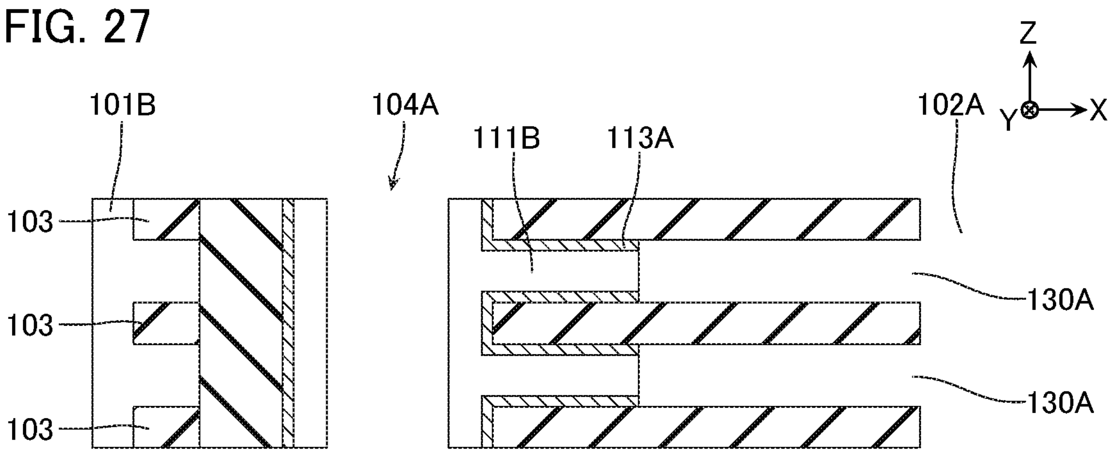
FIG. 27 is a schematic cross-sectional view for describing the manufacturing method.

Next, for example, as illustrated in FIG. 26 and FIG. 27, an opening 130A is formed at a position corresponding to the capacitor structure 130. In this process, the sacrifice layer MLA is removed via the opening 102A. Additionally, in the conductive layer 113A, a part covering a side surface of the sacrifice layer 111B on one side in the X-direction (a side surface of the sacrifice layer 111B on an opening 102A side) is removed. In this process, the side surface of the sacrifice layer 111B in the X-direction is exposed to an inside of the opening 102A. This process is, for example, performed by wet etching or the like.

Figure 28:
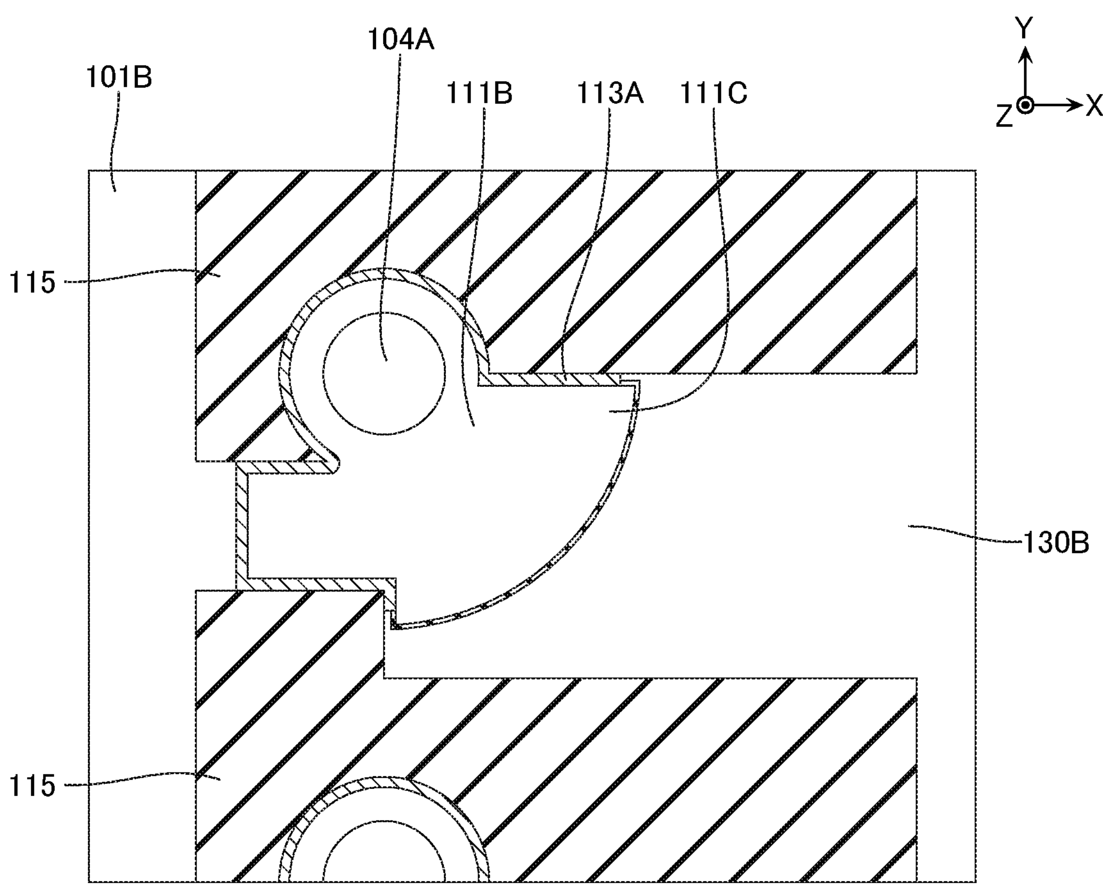
FIG. 28 is a schematic cross-sectional view for describing the manufacturing method.
Figure 29:
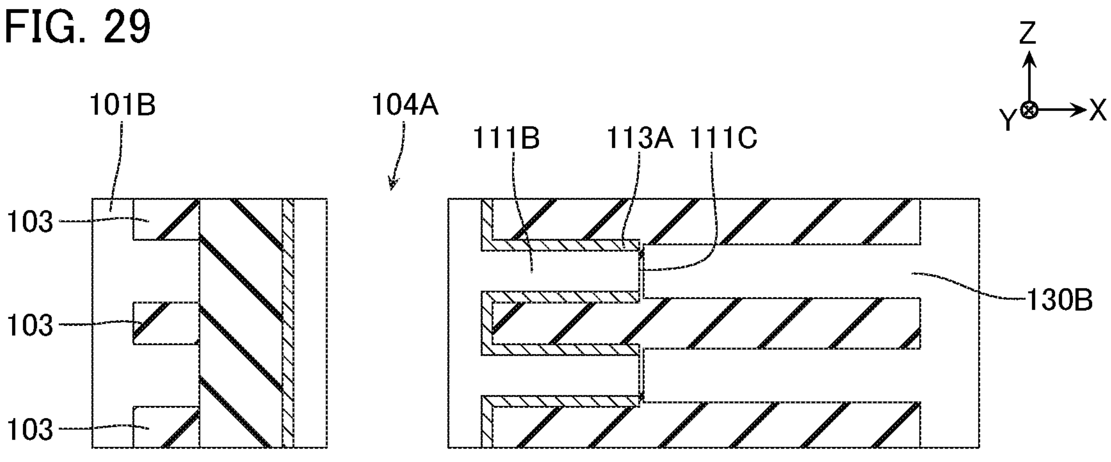
FIG. 29 is a schematic cross-sectional view for describing the manufacturing method.

Next, for example, as illustrated in FIG. 28 and FIG. 29, via the opening 102A and the opening 130A, an oxidation process is performed on the sacrifice layer 111B to form an insulating layer 111C. A sacrifice layer 130B, such as silicon (Si), is embedded into the opening 102A and the opening 130A. This process is, for example, performed by CVD or the like.

Figures 30, 31:
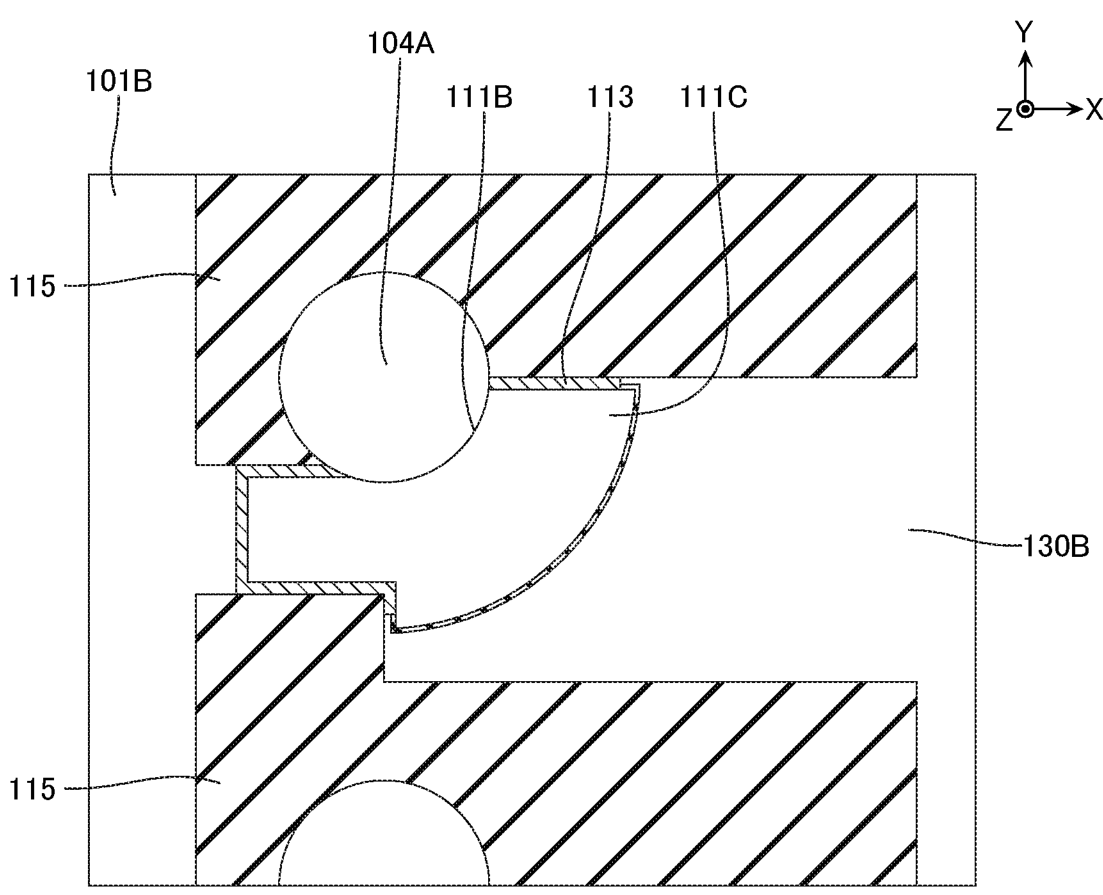
FIG. 30 is a schematic cross-sectional view for describing the manufacturing method.
FIG. 31 is a schematic cross-sectional view for describing the manufacturing method.

Next, for example, as illustrated in FIG. 30 and FIG. 31, the conductive layer 113 is formed. In this process, for example, in the sacrifice layer 111B, a part disposed on the inner peripheral surface of the opening 104A is removed. Next, in the conductive layer 113A, a part disposed on the inner peripheral surface of the opening 104A is removed and the conductive layer 113A is separated in the Z-direction. This process is, for example, performed by wet etching or the like.

Figures 32, 33:
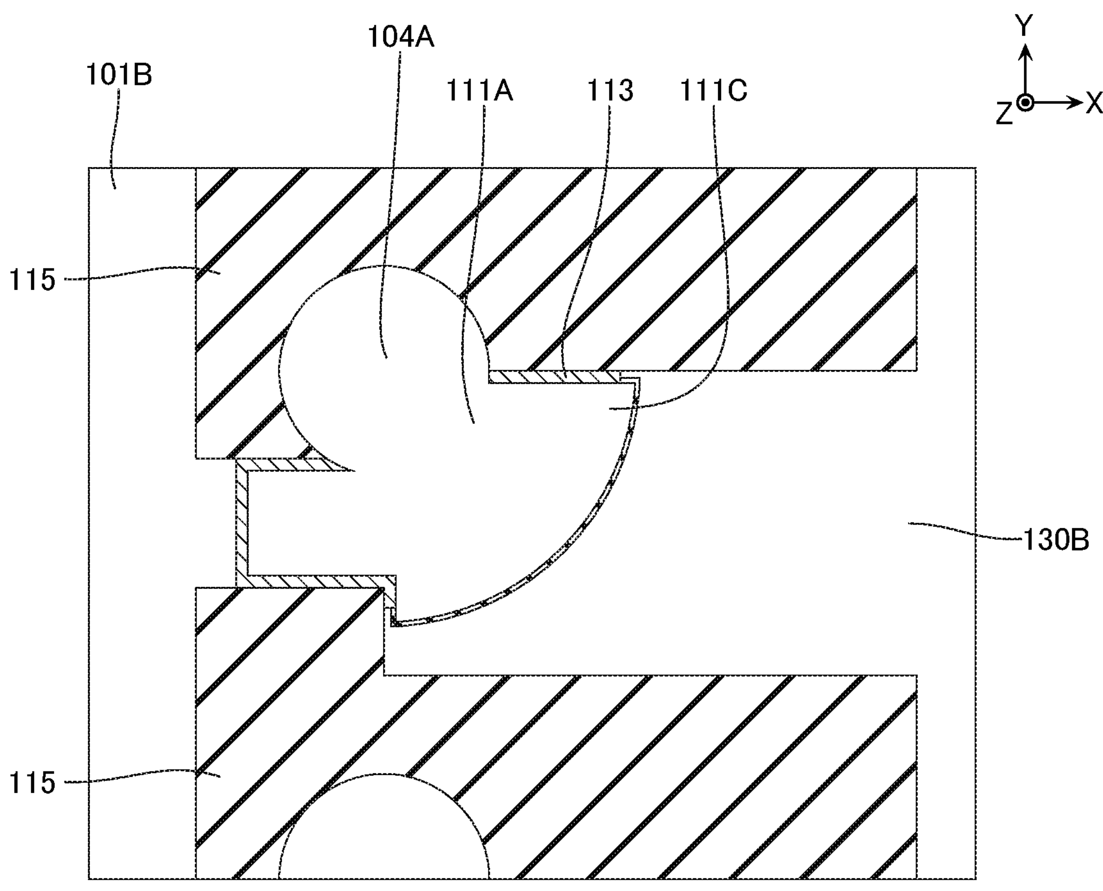
FIG. 32 is a schematic cross-sectional view for describing the manufacturing method.
FIG. 33 is a schematic cross-sectional view for describing the manufacturing method.

Next, for example, as illustrated in FIG. 32 and FIG. 33, the sacrifice layer 111B is removed. This process is, for example, performed by wet etching or the like.

Figures 34, 35:
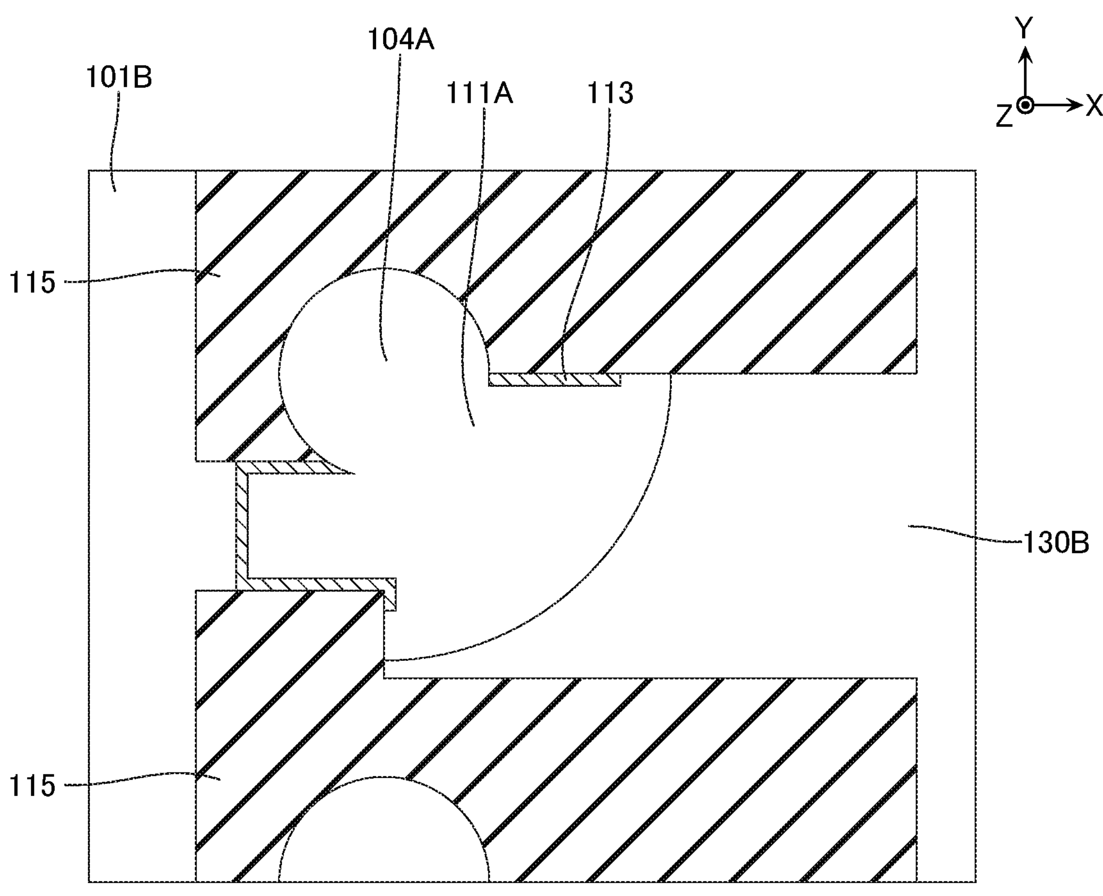
FIG. 34 is a schematic cross-sectional view for describing the manufacturing method.
FIG. 35 is a schematic cross-sectional view for describing the manufacturing method.

Next, for example, as illustrated in FIG. 34 and FIG. 35, the insulating layer 111C and a part of the sacrifice layer 130B are removed. This process is, for example, performed by wet etching or the like.

Figure 36:
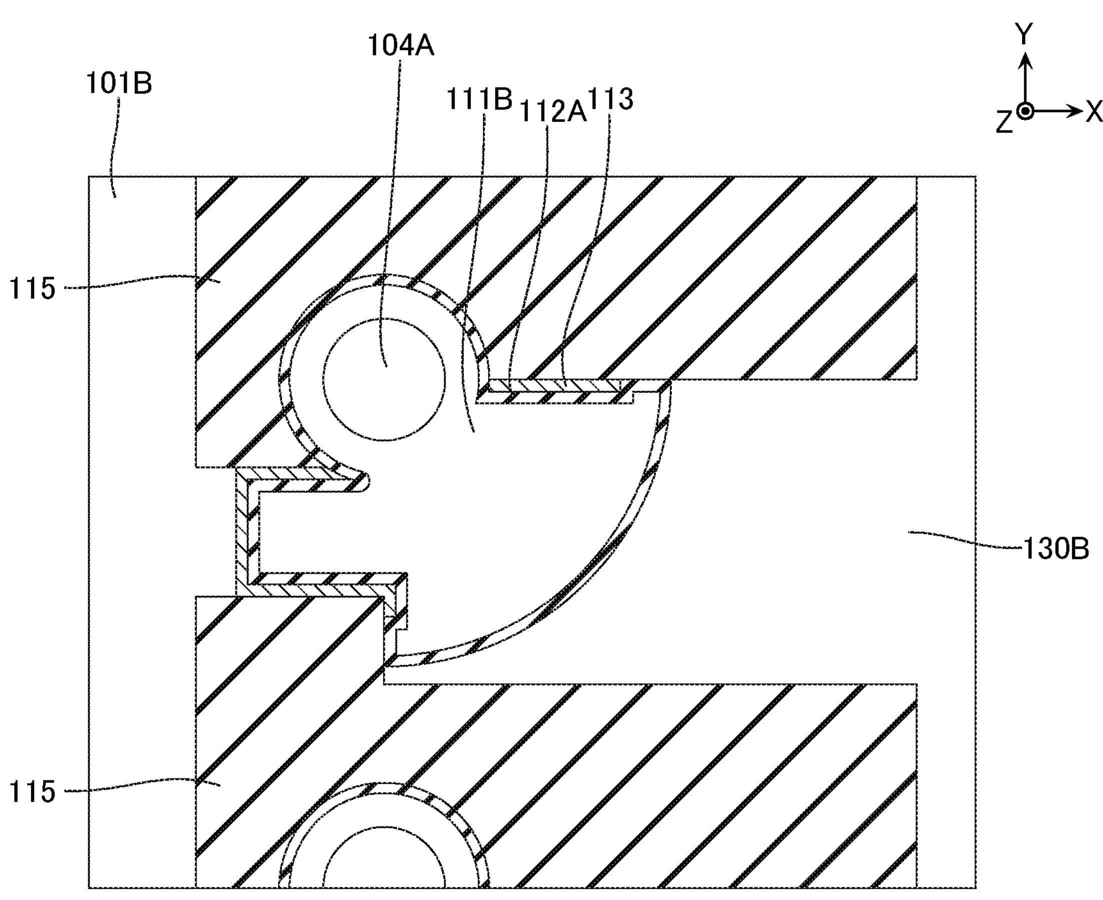
FIG. 36 is a schematic cross-sectional view for describing the manufacturing method.
Figure 37:
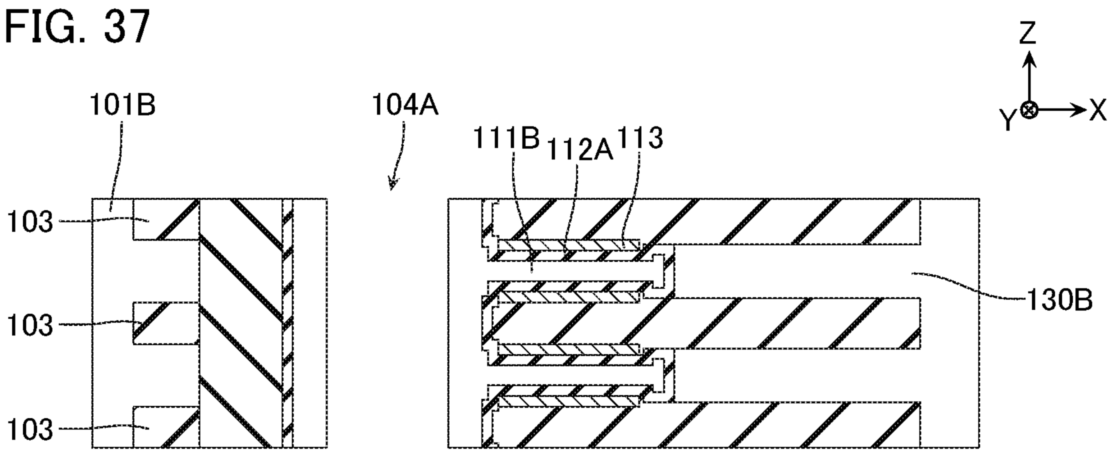
FIG. 37 is a schematic cross-sectional view for describing the manufacturing method.

Next, for example, as illustrated in FIG. 36 and FIG. 37, an insulating layer 112A and the sacrifice layer 111B are formed on the insides of the opening 111A and the opening 104A. The insulating layer 112A is formed on an upper surface, a lower surface, and an exposed surface to the opening 111A of the conductive layer 113, a part of an upper surface, a part of a lower surface, and an exposed surface to the opening 104A of the insulating layer 103, a part of a side surface of the sacrifice layer 130B in the X-direction, and a part of the side surface of the insulating layer 115. The opening 111A is embedded with the sacrifice layer 111B and the opening 104A is not embedded with the sacrifice layer 111B. This process is, for example, performed by CVD or the like. Note that while the illustration is omitted, after forming the insulating layer 112A and the sacrifice layer 111B, the upper portion of the opening 104A is obstructed by the insulating layer or the like.

Figure 38:
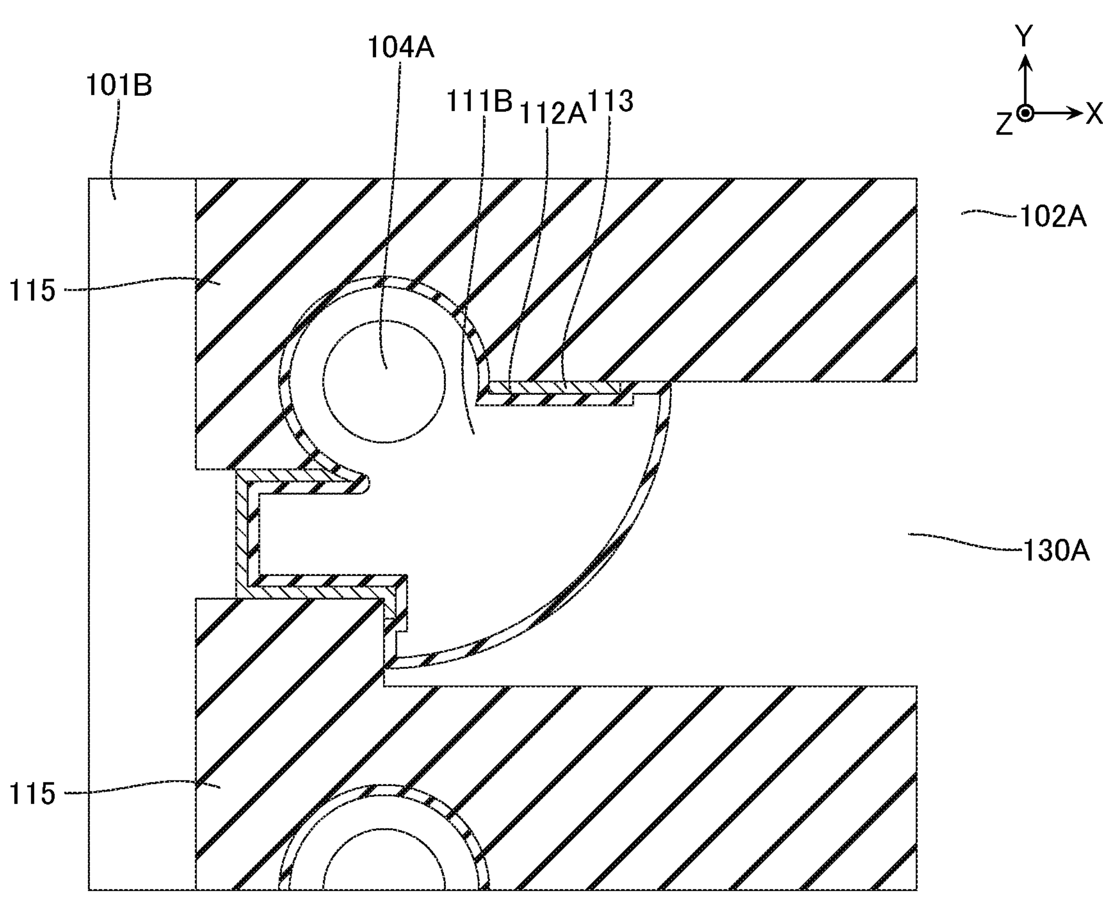
FIG. 38 is a schematic cross-sectional view for describing the manufacturing method.
Figure 39:
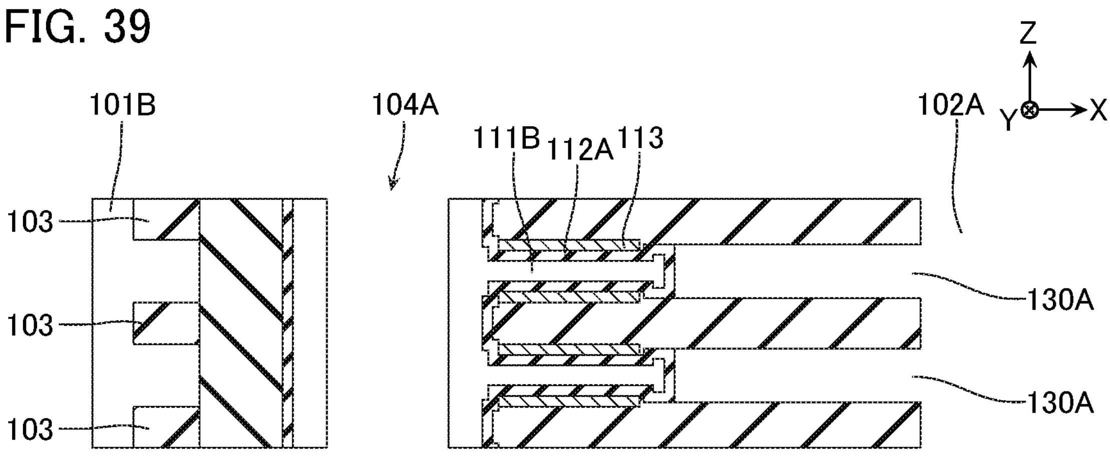
FIG. 39 is a schematic cross-sectional view for describing the manufacturing method.

Next, for example, as illustrated in FIG. 38, and FIG. 39, the sacrifice layer 130B is removed. This process is, for example, performed by wet etching or the like.

Figure 40:
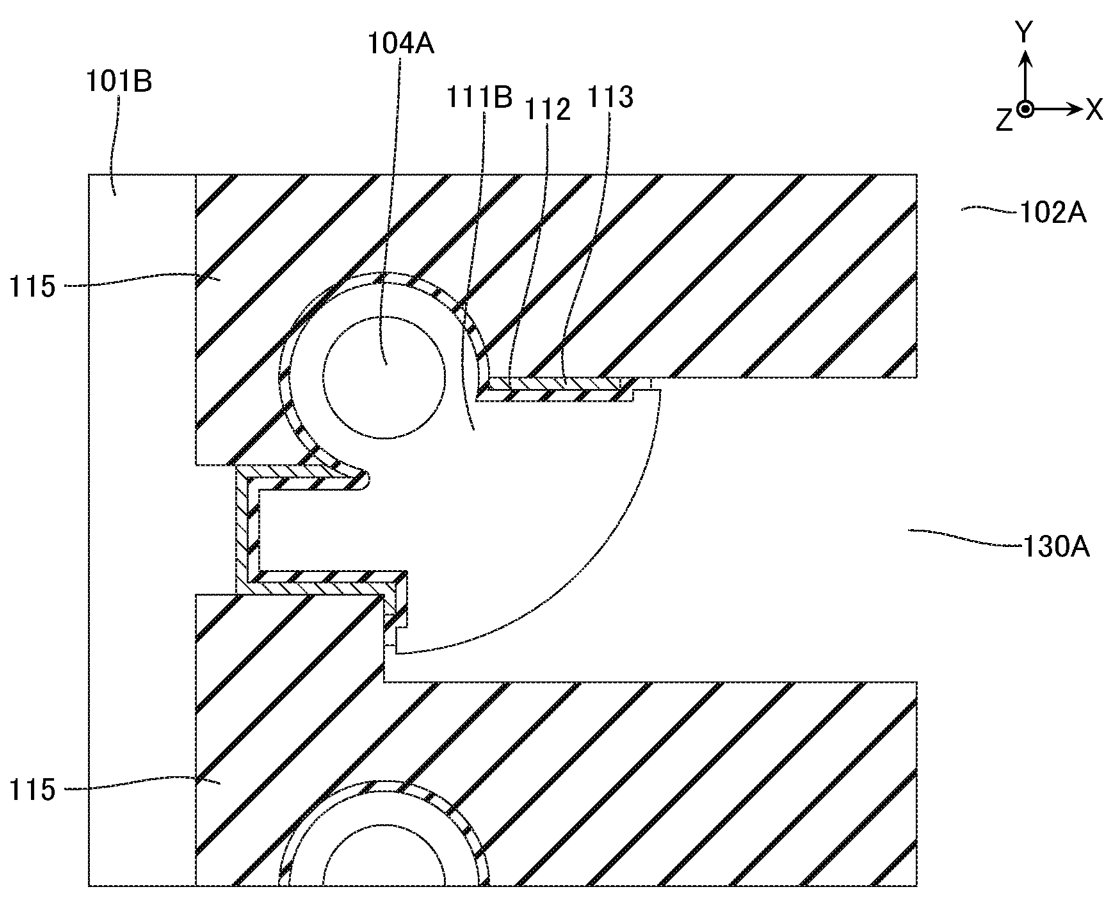
FIG. 40 is a schematic cross-sectional view for describing the manufacturing method.
Figure 41:
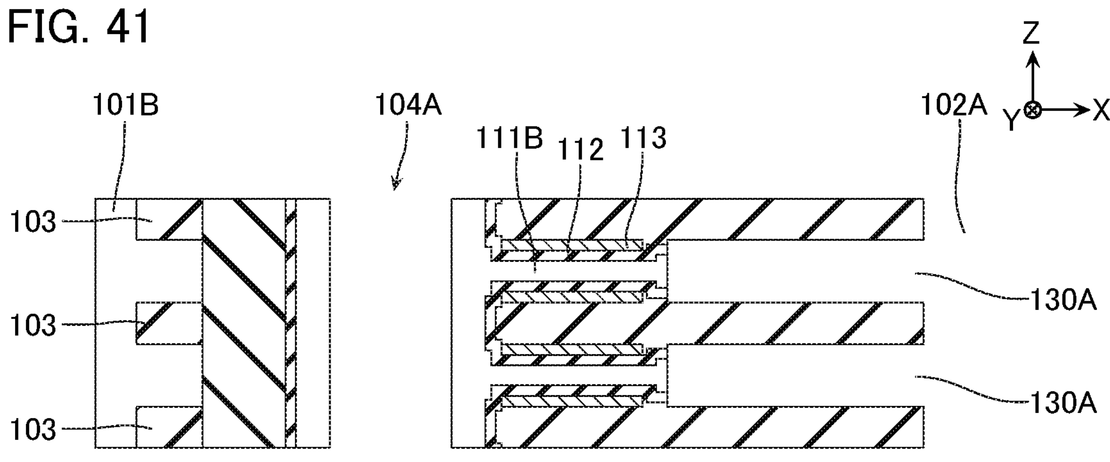
FIG. 41 is a schematic cross-sectional view for describing the manufacturing method.

Next, for example, as illustrated in FIG. 40 and FIG. 41, the insulating layer 112 is formed. In this process, via the opening 102A and the opening 130A, in the insulating layer 112A, a part covering a side surface of the sacrifice layer 111B on one side (on the opening 102A side) in the X-direction is removed. In this process, the side surface of the sacrifice layer 111B in the X-direction is exposed to the inside of the opening 102A. This process is, for example, performed by wet etching or the like.

Figure 42:
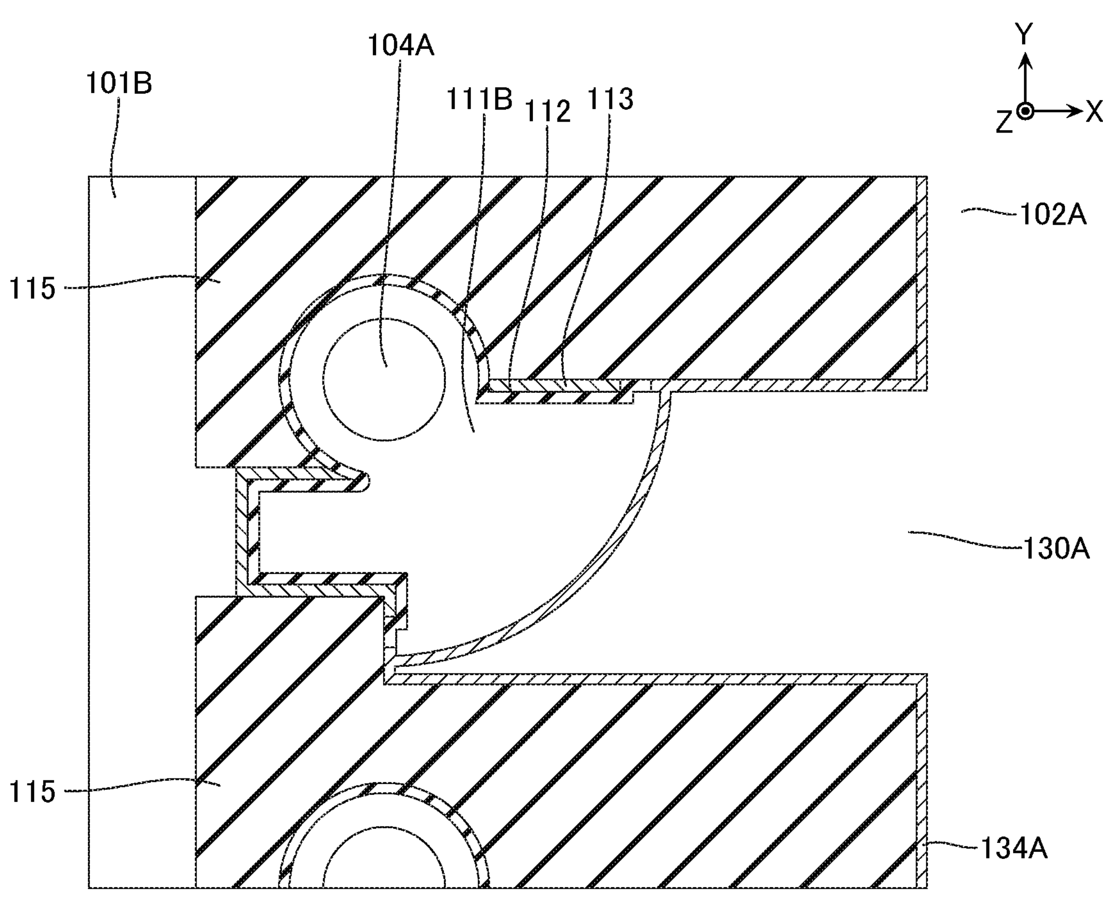
FIG. 42 is a schematic cross-sectional view for describing the manufacturing method.
Figure 43:
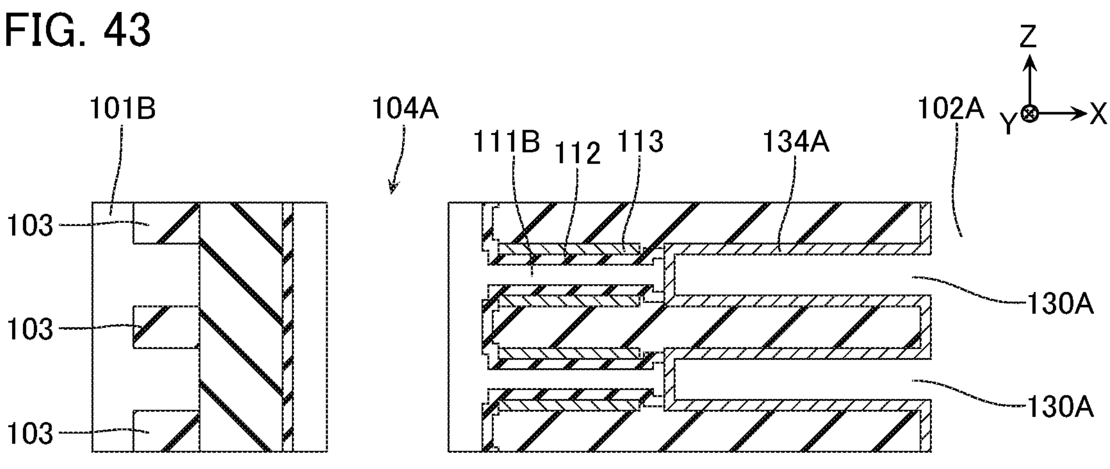
FIG. 43 is a schematic cross-sectional view for describing the manufacturing method.

Next, for example, as illustrated in FIG. 42 and FIG. 43, via the opening 102A and the opening 130A, a conductive layer 134A is formed on a side surface of the sacrifice layer 111B on one side in the X-direction (on the opening 102A side), a side surface of the insulating layer 115 on one side in the X-direction (the opening 102A side) and both side surfaces of the insulating layer 115 in the Y-direction, and an upper surface, a lower surface, and a side surface on one side in the X-direction (the opening 102A side) of the insulating layer 103. This process is, for example, performed by Atomic Layer Deposition (ALD) or the like.

Figure 44:
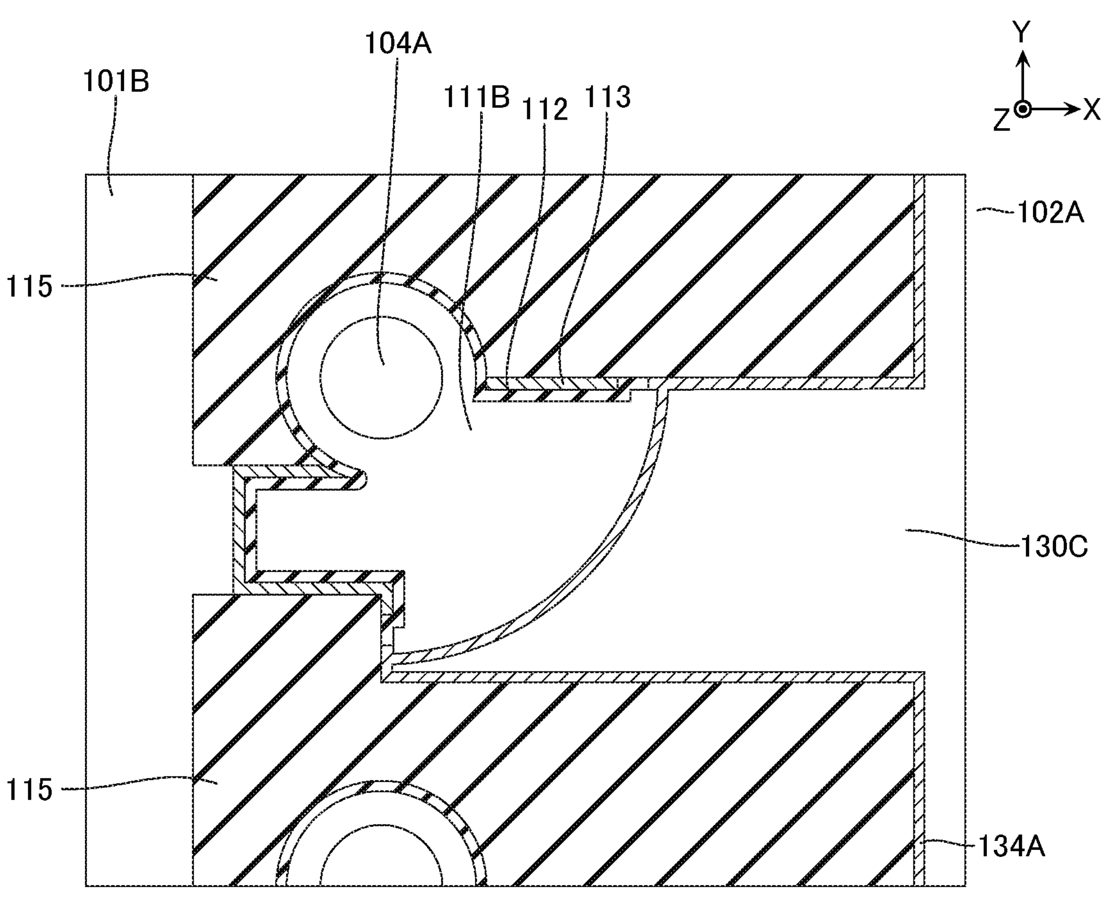
FIG. 44 is a schematic cross-sectional view for describing the manufacturing method.
Figure 45:
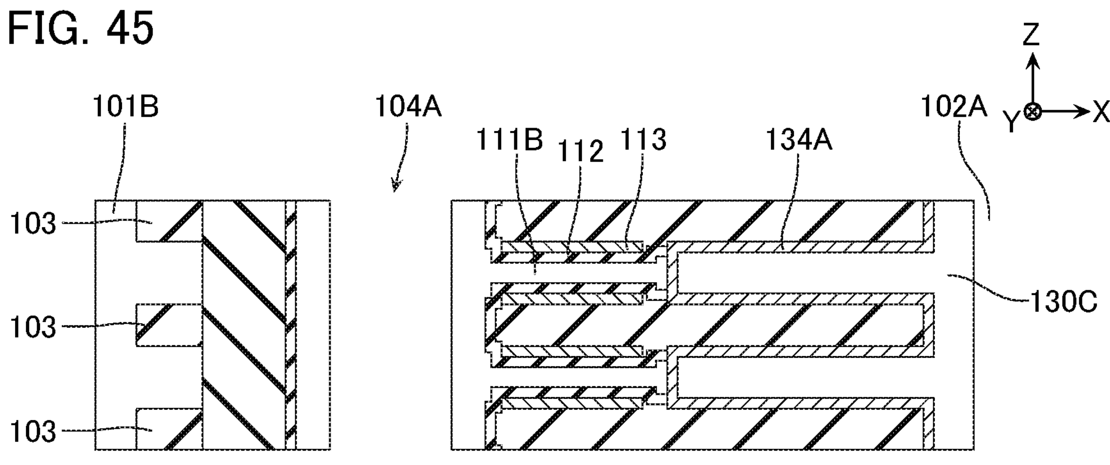
FIG. 45 is a schematic cross-sectional view for describing the manufacturing method.

Next, for example, as illustrated in FIG. 44 and FIG. 45, a sacrifice layer 130C, such as silicon (Si), is formed on the inside of the opening 102A. The opening 130A is embedded with the sacrifice layer 130C and the opening 102A is not embedded with the sacrifice layer 130C. This process is, for example, performed by CVD or the like.

Figure 46:
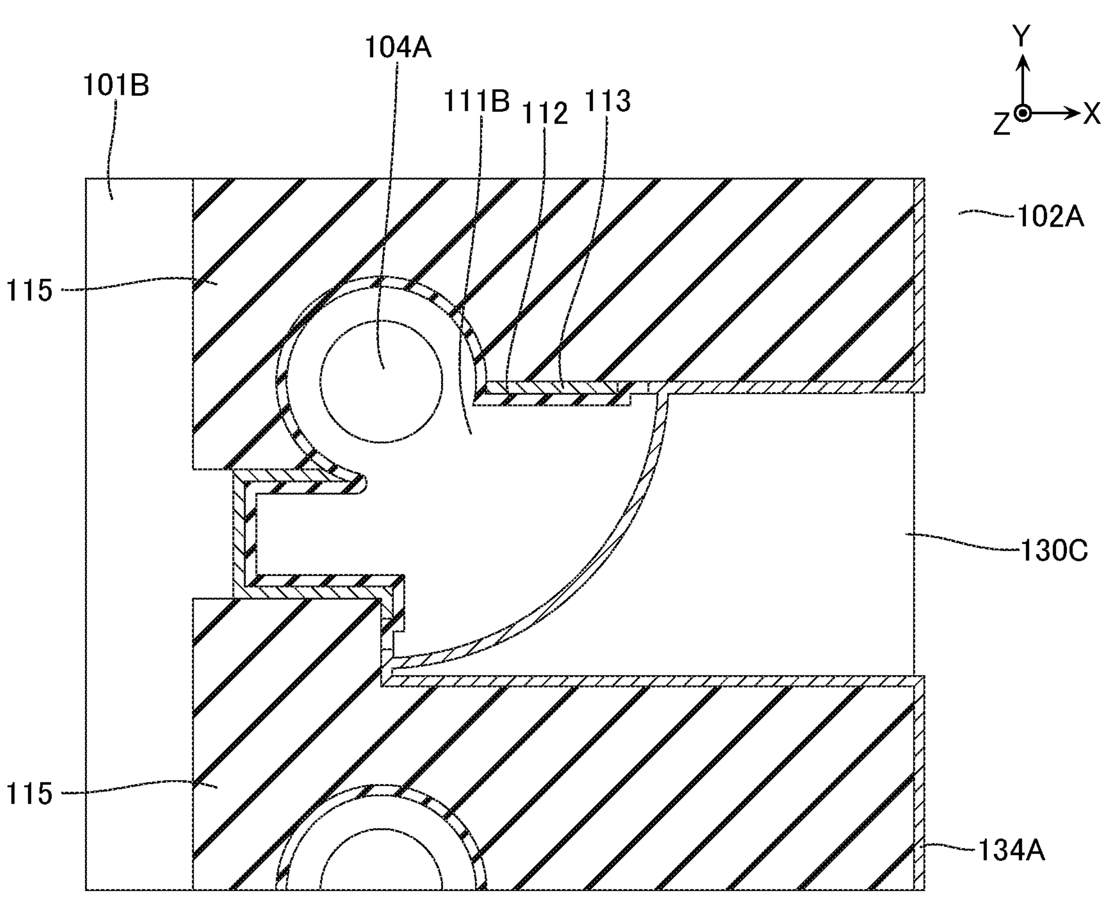
FIG. 46 is a schematic cross-sectional view for describing the manufacturing method.
Figure 47:
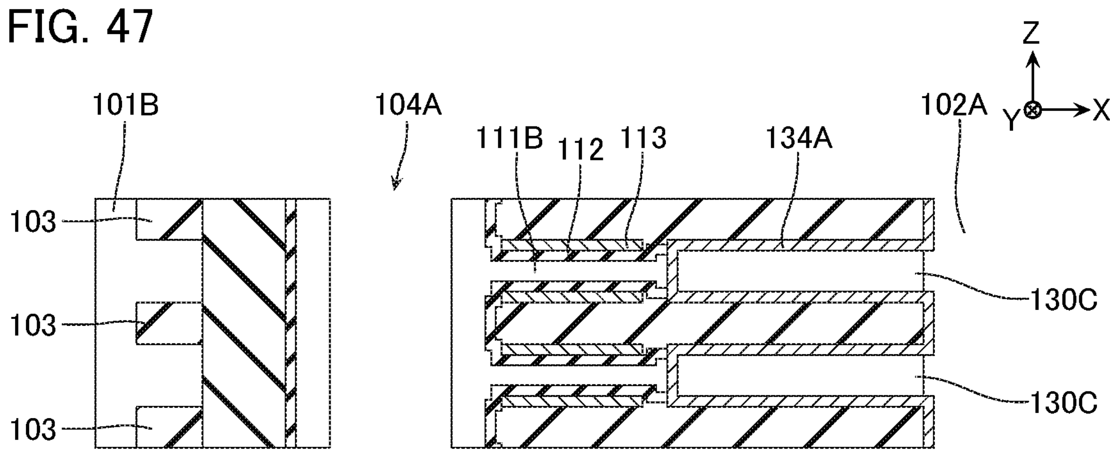
FIG. 47 is a schematic cross-sectional view for describing the manufacturing method.

Next, for example, as illustrated in FIG. 46 and FIG. 47, via the opening 102A, a part of the sacrifice layer 130C is removed. In this process, for example, parts of the conductive layer 134A disposed on side surfaces of the insulating layer 115 and the insulating layer 103 in the X-direction are exposed. This process is, for example, performed by wet etching or the like.

Figure 48:
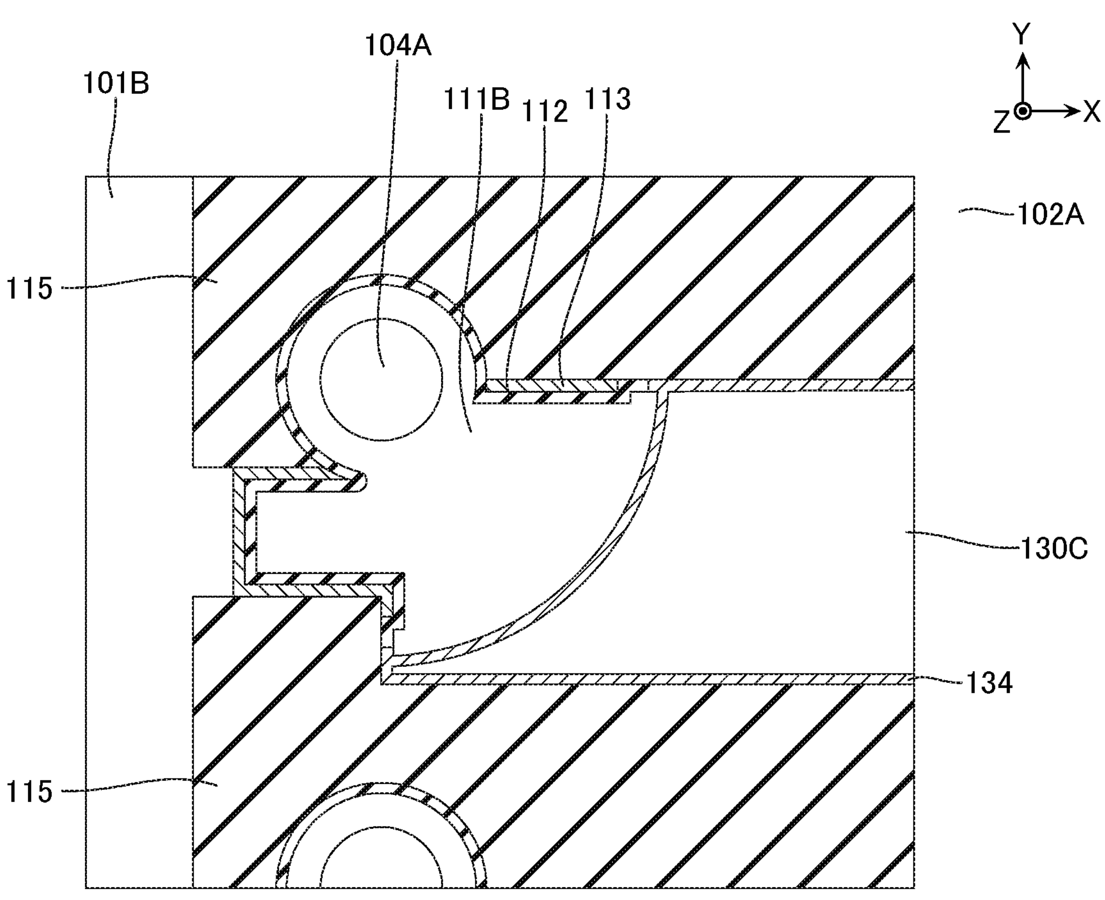
FIG. 48 is a schematic cross-sectional view for describing the manufacturing method.
Figure 49:
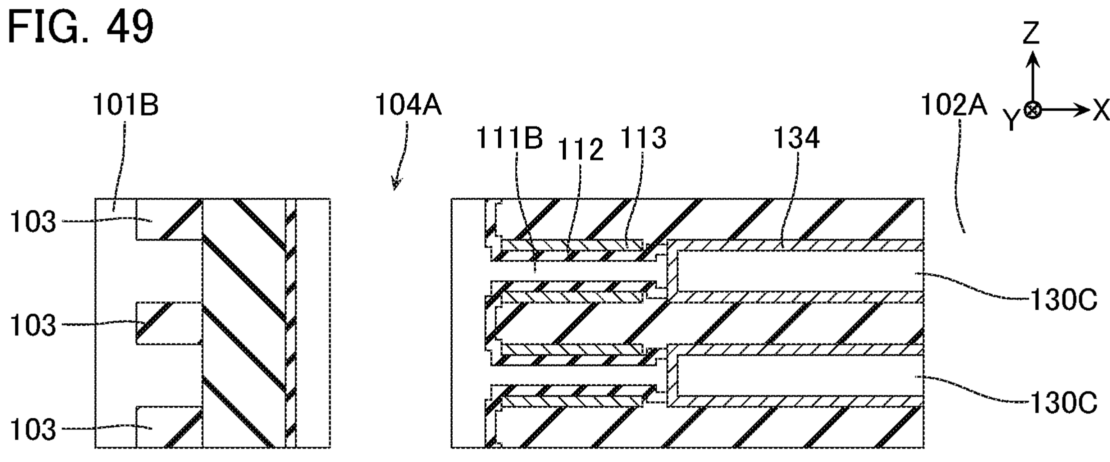
FIG. 49 is a schematic cross-sectional view for describing the manufacturing method.

Next, for example, as illustrated in FIG. 48 and FIG. 49, the conductive layer 134 is formed. In this process, for example, a part of the conductive layer 134A disposed on side surfaces of the insulating layer 115 and the insulating layer 103 in the X-direction is removed to separate the conductive layer 134A in the Y-direction and the Z-direction. This process is, for example, performed by wet etching or the like.

Figure 50:
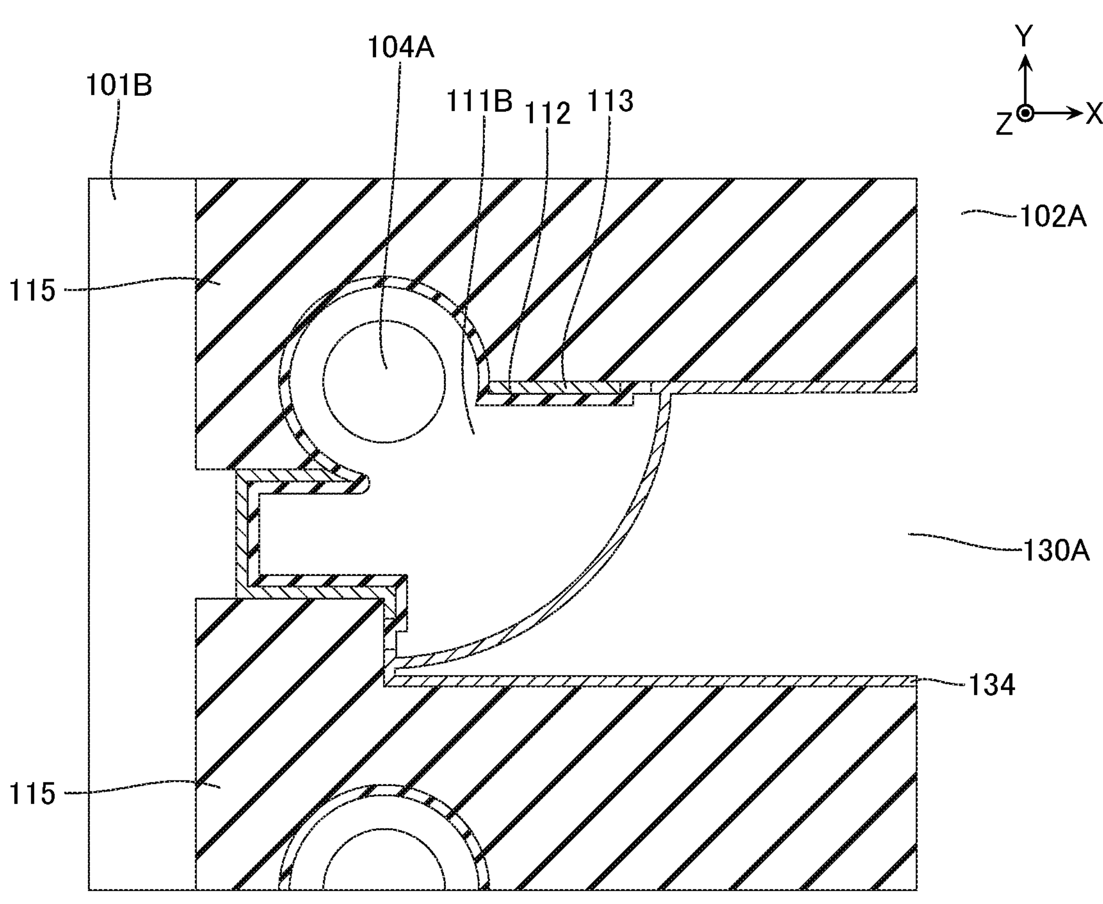
FIG. 50 is a schematic cross-sectional view for describing the manufacturing method.
Figure 51:
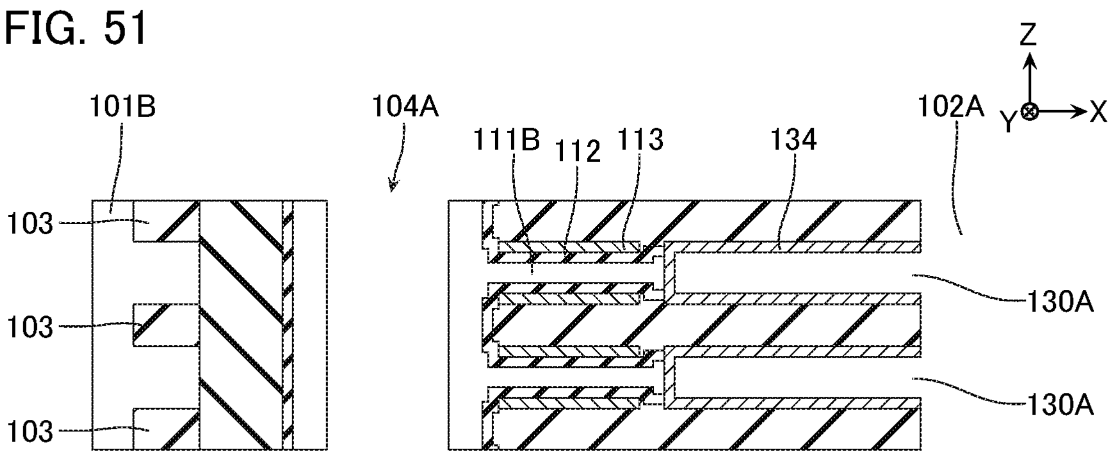
FIG. 51 is a schematic cross-sectional view for describing the manufacturing method.

Next, for example, as illustrated in FIG. 50 and FIG. 51, the sacrifice layer 130C is removed. This process is, for example, performed by wet etching or the like.

Figure 52:
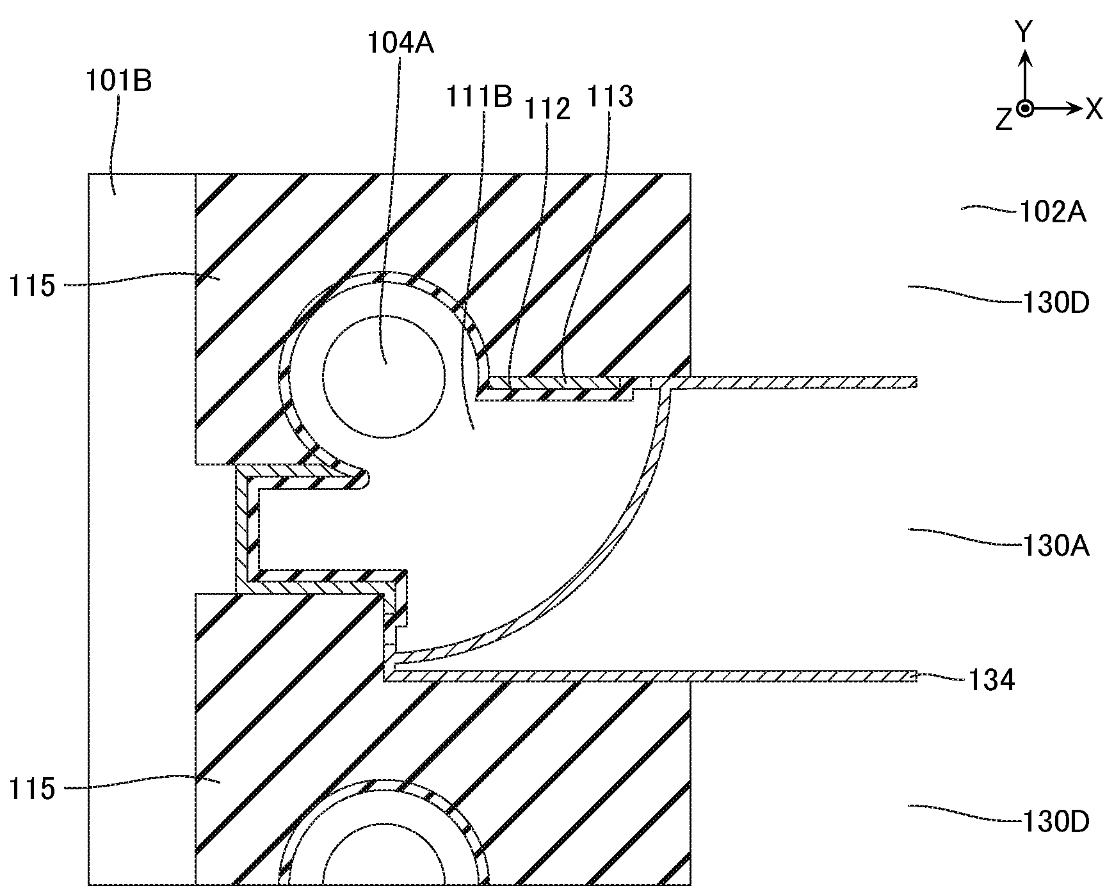
FIG. 52 is a schematic cross-sectional view for describing the manufacturing method.
Figure 53:
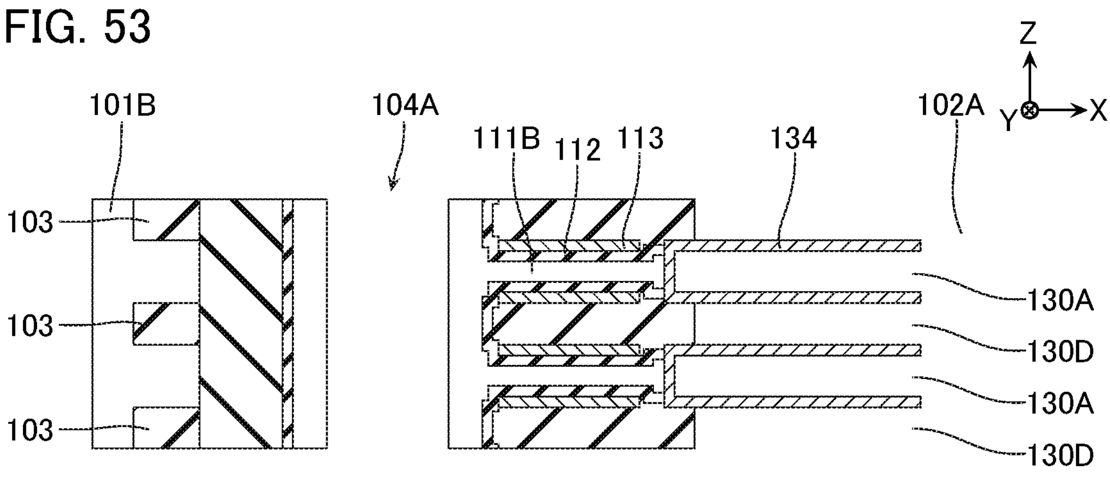
FIG. 53 is a schematic cross-sectional view for describing the manufacturing method.

Next, for example, as illustrated in FIG. 52 and FIG. 53, via the opening 102A, a part of the insulating layer 115 (FIG. 32) and a part of the insulating layer 103 (FIG. 31) are removed to form an opening 130D. In the illustrated example, a region inside the conductive layer 134 is indicated as the opening 130A and a region outside the conductive layer 134 is indicated as the opening 130D. In this process, the insulating layer 115 (FIG. 32) and the insulating layers 103 (FIG. 31) are removed in a range that the conductive layer 113 is not exposed to the opening 130D. This process is, for example, performed by wet etching or the like.

Figure 54:
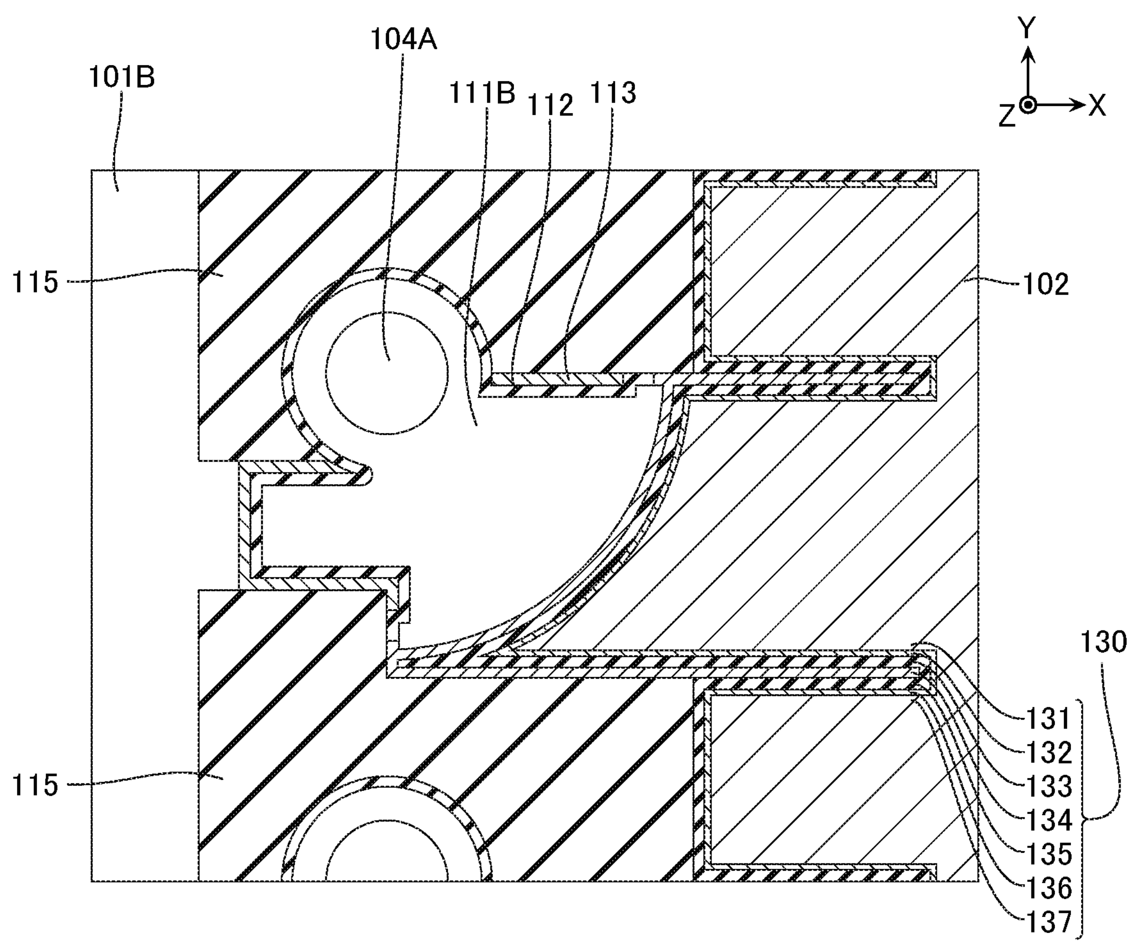
FIG. 54 is a schematic cross-sectional view for describing the manufacturing method.
Figure 55:
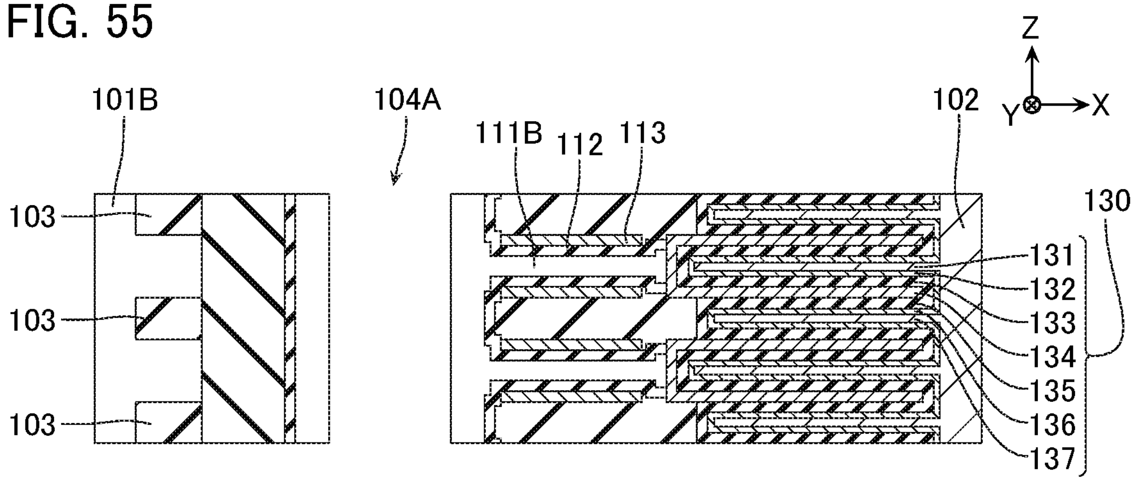
FIG. 55 is a schematic cross-sectional view for describing the manufacturing method.

Next, for example, as illustrated in FIG. 54 and FIG. 55, via the opening 130A, the opening 130D, and the opening 102A, the insulating layers 133, 135, the conductive layers 132, 136, and the conductive layer 131, 137, 102 are formed on an upper surface, a lower surface, a side surface on one side in the X-direction (a side surface on the opening 102A side), and both side surfaces in the Y-direction of the conductive layer 134. This process is, for example, performed by CVD or the like.

Figure 56:
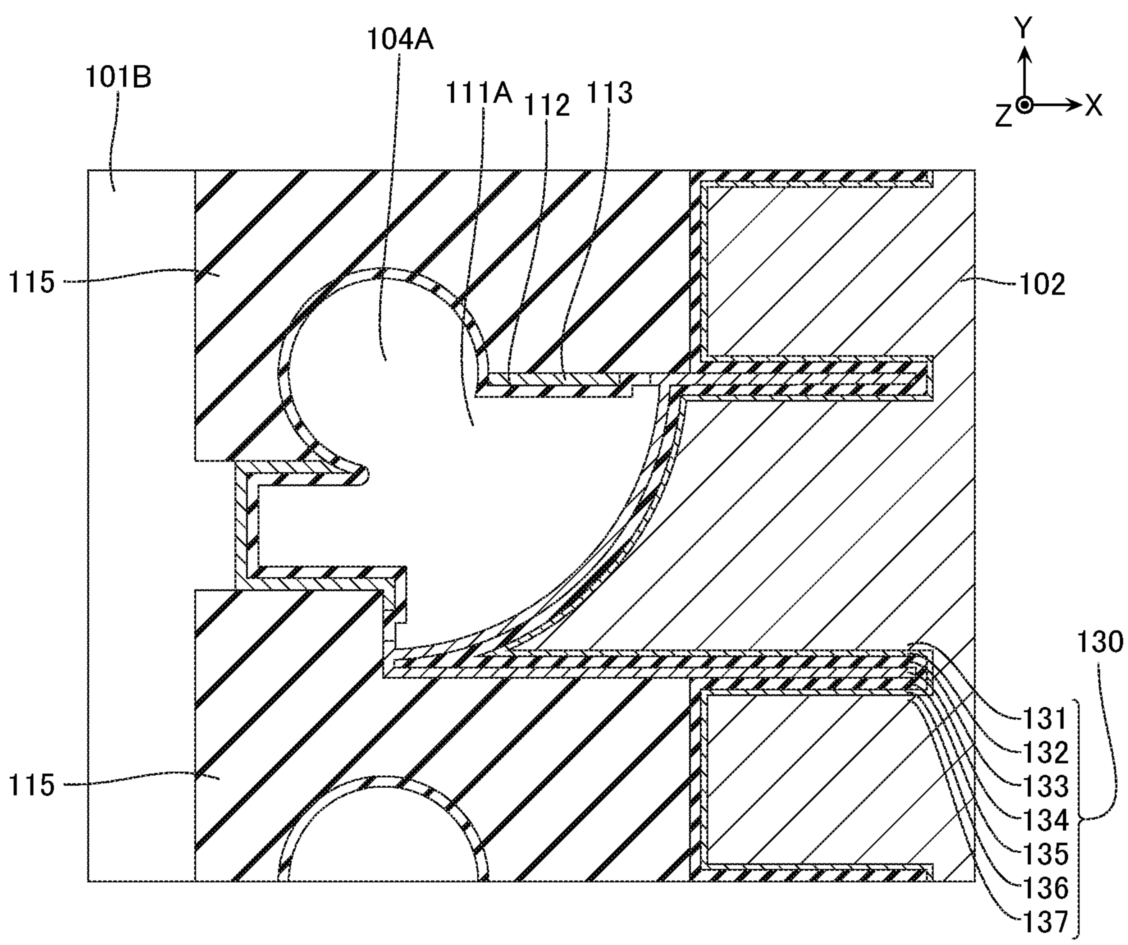
FIG. 56 is a schematic cross-sectional view for describing the manufacturing method.
Figure 57:
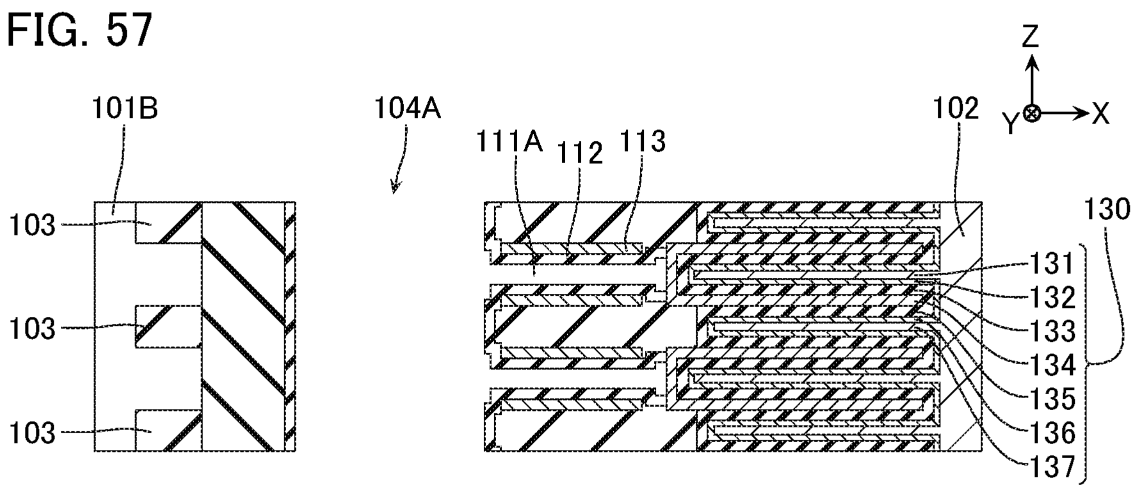
FIG. 57 is a schematic cross-sectional view for describing the manufacturing method.

Next, for example, as illustrated in FIG. 56 and FIG. 57, the sacrifice layer 111B is removed. This process is, for example, performed by wet etching or the like.

Figure 58:
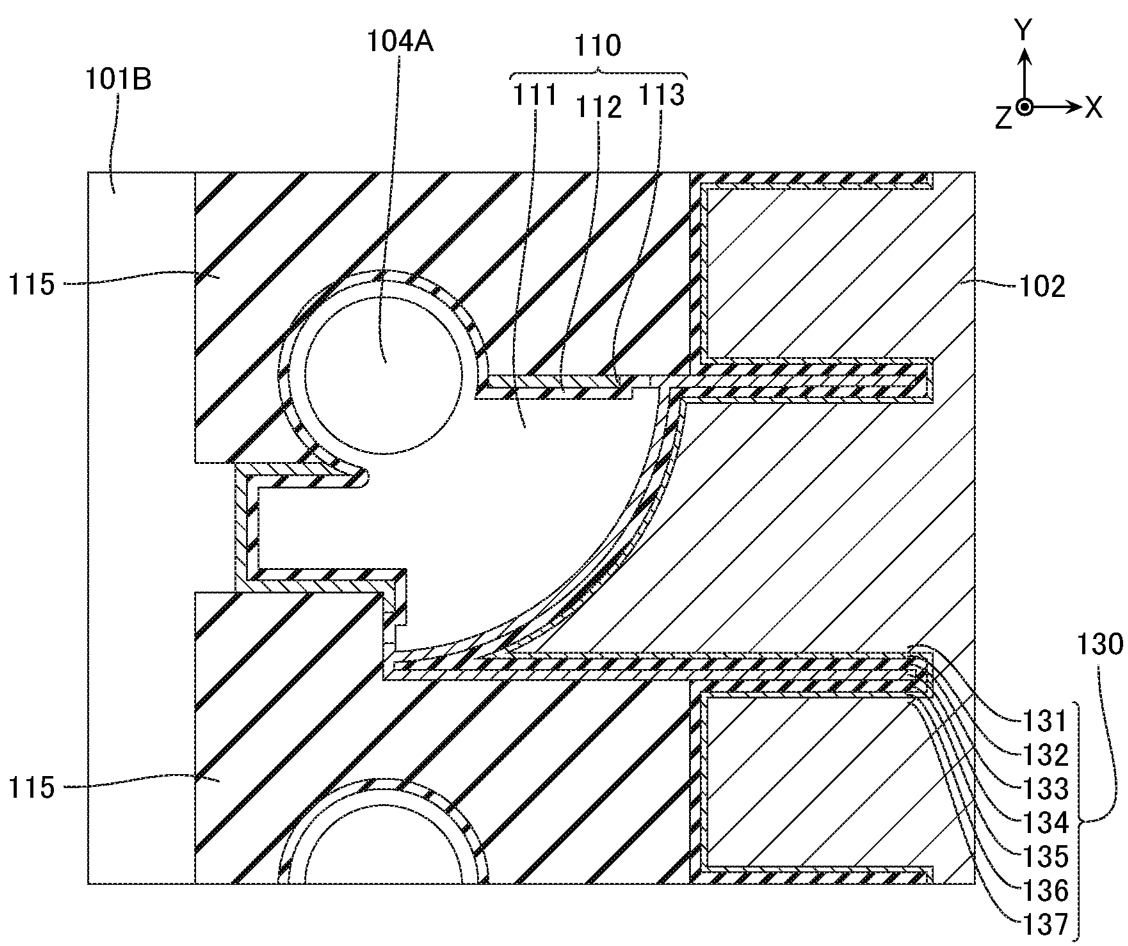
FIG. 58 is a schematic cross-sectional view for describing the manufacturing method.
Figure 59:
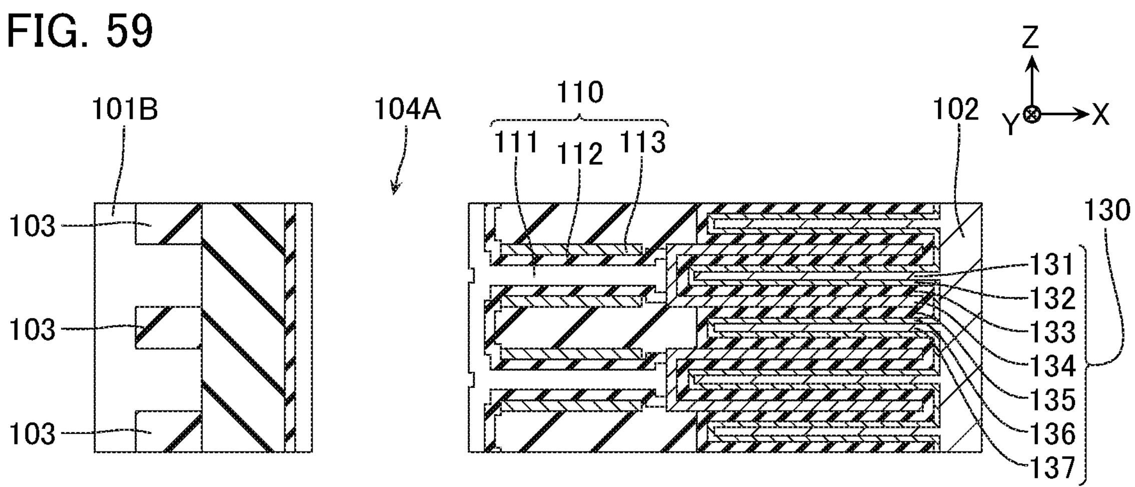
FIG. 59 is a schematic cross-sectional view for describing the manufacturing method.

Next, for example, as illustrated in FIG. 58 and FIG. 59, the semiconductor layer 111 is formed on the insides of the opening 111A and the opening 104A. The opening 111A is embedded with the semiconductor layer 111. The opening 104A is not embedded with the semiconductor layer 111. This process is, for example, performed by ALD or the like.

Figures 60, 61:
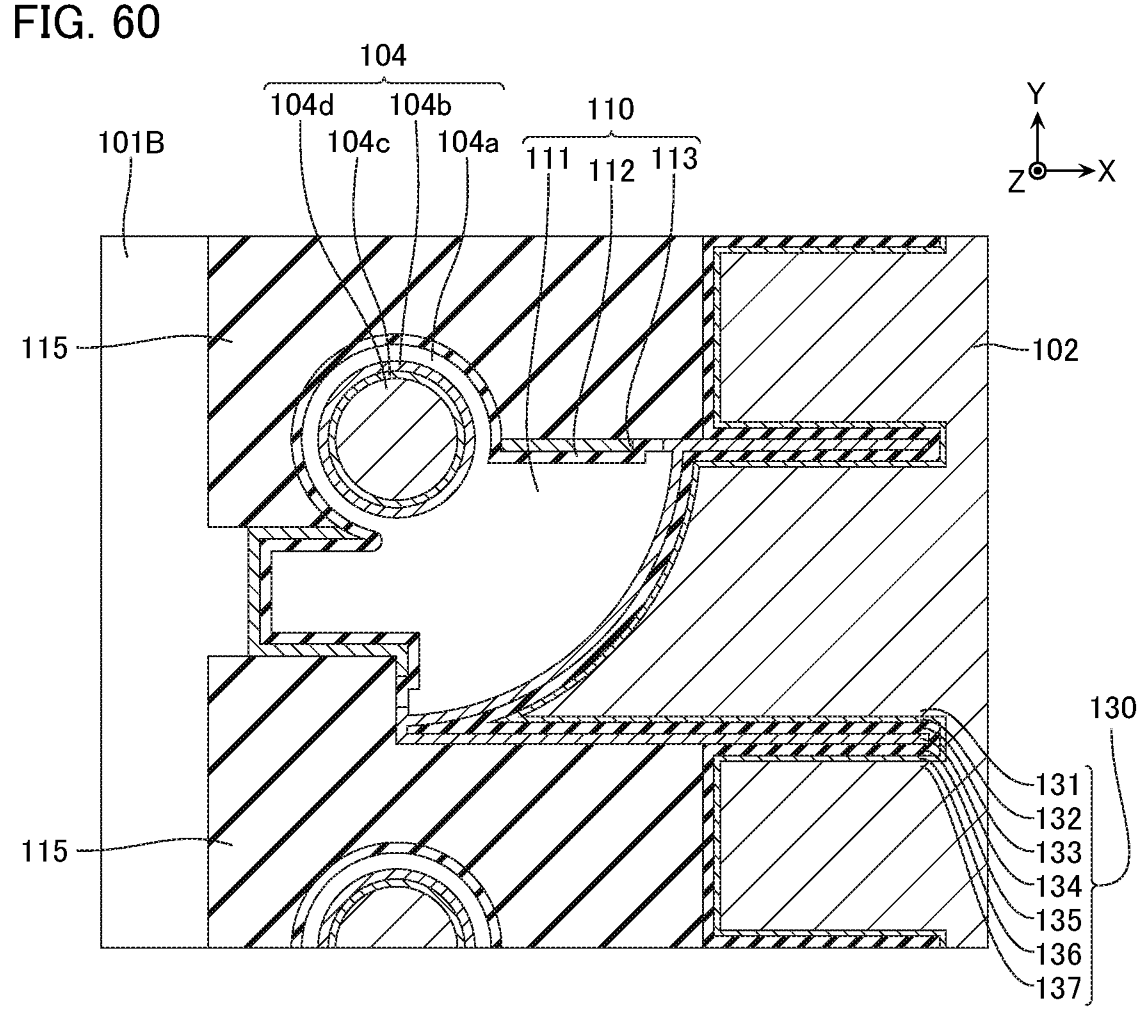
FIG. 60 is a schematic cross-sectional view for describing the manufacturing method.
FIG. 61 is a schematic cross-sectional view for describing the manufacturing method.

Next, for example, as illustrated in FIG. 60 and FIG. 61, the via-wiring 104 is formed on the inside of the opening 104A. This process is, for example, performed by ALD, CVD, and the like.

Next, for example, as illustrated in FIG. 62 and FIG. 63, the sacrifice layer 101B is removed. This process is, for example, performed by wet etching or the like.

Afterwards, for example, as illustrated in FIG. 6 and FIG. 7, the conductive layer 120 is formed on the inside of the opening 120A. This process is, for example, performed by CVD or the like.

Effects

The semiconductor memory device according to the embodiment includes the plurality of memory layers ML arranged in the Z-direction and the via-wiring 104 extending in the Z-direction. The plurality of memory layers ML each include the transistor structure 110, the capacitor structure 130 disposed on one side with respect to the transistor structure 110 in the X-direction, and the conductive layer 120 disposed on the other side with respect to the transistor structure 110 in the X-direction.

Even when the number of memory layers ML included in the memory cell array MCA increases, such a configuration is manufacturable without the increase in the number of processes except for the stacking process (the process described with reference to FIG. 11). Therefore, increasing high integration can be comparatively easily achieved.

In the transistor structure 110 according to the embodiment, the conductive layer 113 is opposed to the upper surface and the lower surface of the semiconductor layer 111.

With such a configuration, an interference of an electric field between the plurality of semiconductor layers 111 arranged in the Z-direction can be reduced. Therefore, even when increasing high integration of the memory cell array MCA in the Z-direction is achieved, the semiconductor layer 111 can be preferably controlled to an ON state or an OFF state, and the semiconductor memory device that preferably operates can be provided.

When the transistor TrC is set to an ON state, channels are formed on an upper surface, a lower surface, and both side surfaces in the Y-direction of the semiconductor layer 111. Therefore, an ON current of the transistor TrC can be comparatively increased. Thus, the operation can be high speed and stabilized.

Here, for example, it is conceivable that the wiring functioning as the word line WL (the wiring extending in the Y-direction) is disposed between the via-wiring 104 and the capacitor structure 130, and a part of the wiring functioning as the word line WL is used as the gate electrode of the transistor TrC. However, in such a structure, the semiconductor layer functioning as the channel region of the transistor TrC intersects with the wiring functioning as the word line WL as viewed from the Z-direction. Therefore, for example, without separating the semiconductor layer in the X-direction, the wiring extending in the Y-direction needs to be processed, and a degree of difficulty of manufacturing is high. Additionally, a width of the memory layer in the Z-direction increases.

In this respect, in the embodiment, the conductive layer 120 that functions as the word line WL is disposed on the side opposite to the plate line PL with respect to the transistor structure 110 and is disposed at a position not overlapping with the transistor structure 110 as viewed from the Z-direction. Therefore, the conductive layer 120 and the transistor structure 110 can be independently formed and manufacturing can be comparatively easily performed. While a width of the memory layer ML in the Z-direction is reduced, a wiring resistance of the conductive layer 120 can be a comparatively small value.

In such a configuration, the via-wiring 104 that functions as the bit line BL and the conductive layer 113 that functions as the gate electrode of the transistor TrC are opposed via the insulating layer 112. Therefore, parasitic capacitance occurs between the bit line BL and the gate electrode of the transistor TrC. Here, when the parasitic capacitance of the bit line BL is large, the above-described sense amplifier circuit cannot preferably detect electric charge accumulated in the capacitor CpC, and there may be a case where the read operation cannot be preferably performed. Therefore, to preferably perform the read operation in such a configuration, for example, it is considered that an opposed area of the via-wiring 104 and the conductive layer 113 is reduced and an electrostatic capacity between the bit line BL and the gate electrode of the transistor TrC is reduced.

In such a configuration, parasitic capacitance occurs between two conductive layers 113 adjacent in the Z-direction. Here, when the parasitic capacitance between the two conductive layers 113 adjacent in the Z-direction is large, in the read operation and a write operation, an operation speed becomes slow in some cases. Therefore, an area of the conductive layer 113 in the X-Y cross-sectional surface is preferably small.

Therefore, the semiconductor memory device according to the embodiment, as described with reference to FIG. 8, employs a configuration in which a part of the via-wiring 104 (the surface S3) is opposed to the conductive layer 113 and the other parts (the surfaces S1, S2) are not opposed to the conductive layer 113. With such a configuration, the opposed surface area between the via-wiring 104 and the conductive layer 113 can be reduced and the parasitic capacitance between the via-wiring 104 and the conductive layer 113 can be reduced. Additionally, the area in the X-Y cross-sectional surface of the conductive layer 113 can be reduced and the parasitic capacitance between the conductive layers 113 arranged in the Z-direction can be reduced.

In the embodiment, a distance between the conductive layer 120 and the via-wiring 104 is larger than a distance between the conductive layer 113 and the via-wiring 104. Therefore, the parasitic capacitance between the bit line BL and the word line WL can also be reduced.

Additionally, in such a configuration, the configurations in the transistor structure 110 (the semiconductor layer 111, the insulating layer 112, and the conductive layer 113) have the approximately fan shapes including the arc-shaped side surfaces extending along the outer peripheral surface of the via-wiring 104 and the arc-shaped side surfaces extending along the circle c1 (FIG. 3). In such a configuration, since a distance between a connecting part of the semiconductor layer 111 with the via-wiring 104 and a connecting part of the semiconductor layer 111 with the capacitor structure 130 becomes an approximately constant, while sizes of the transistor structure 110 in the X-direction and the Y-direction are minimally reduced, an OFF leakage current in the transistor structure 110 can be reduced.

Second Embodiment

Figure 64:
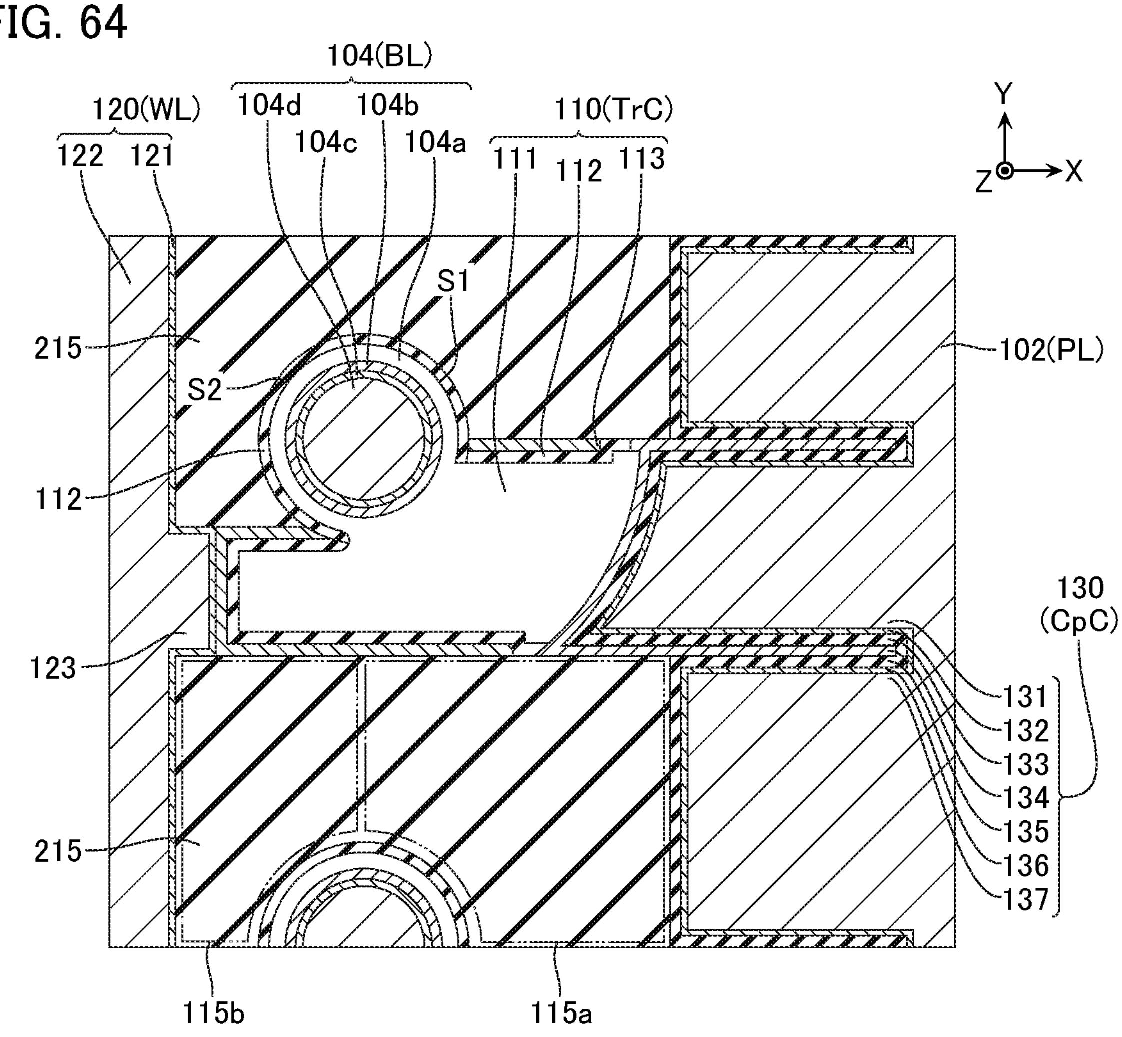
FIG. 64 is a schematic X-Y cross-sectional view illustrating a configuration of a part of a semiconductor memory device according to a second embodiment.
Figure 65:
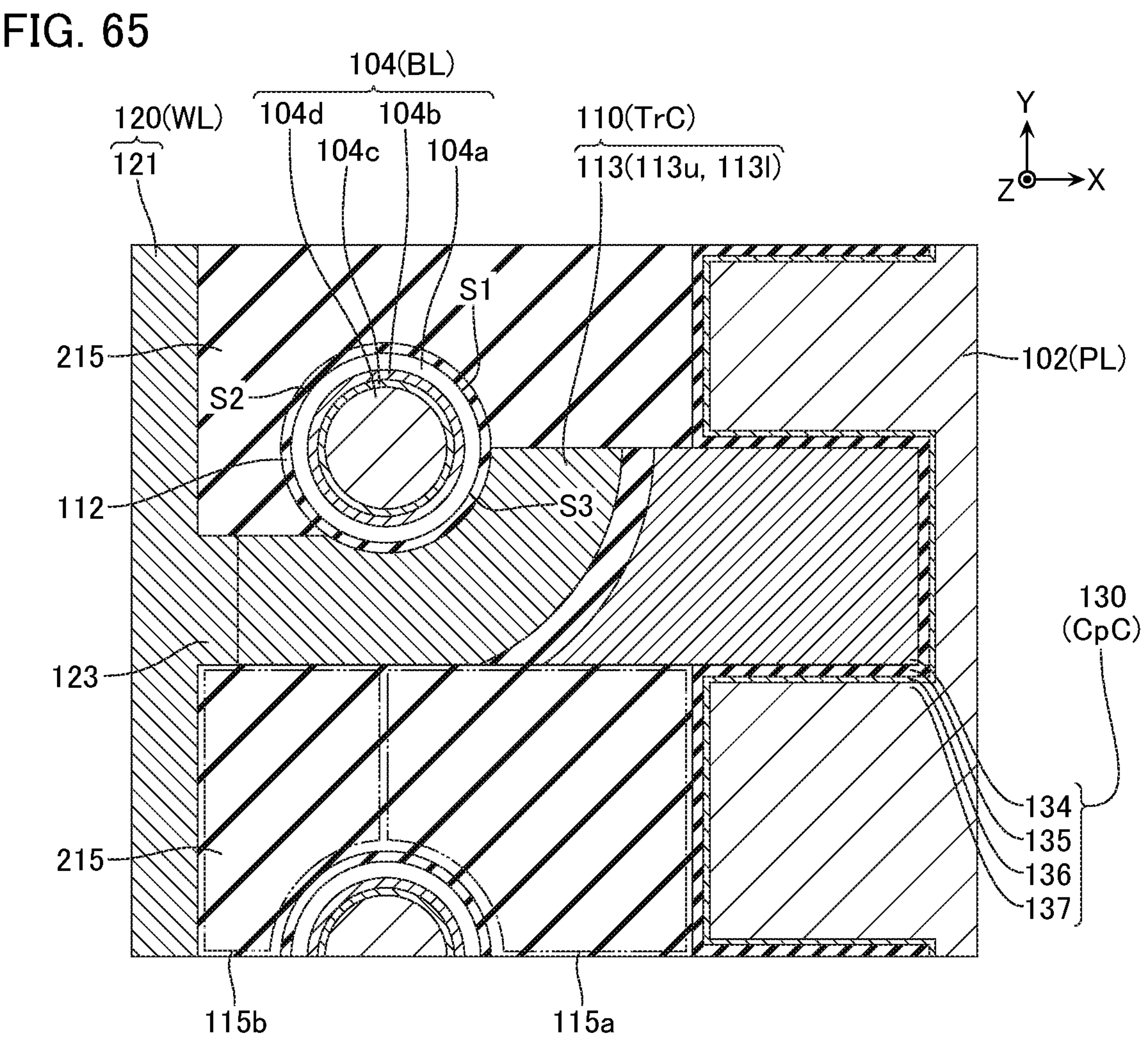
FIG. 65 is a schematic X-Y cross-sectional view illustrating a configuration of a part of a semiconductor memory device according to the second embodiment.

FIG. 64 and FIG. 65 are schematic X-Y cross-sectional views illustrating configurations of parts of a semiconductor memory device according to the second embodiment. FIG. 64 illustrates an X-Y cross-sectional surface at a height position (a position in the Z-direction) corresponding to the semiconductor layer 111. Additionally, FIG. 65 illustrates an X-Y cross-sectional surface at a height position (the position in the Z-direction) corresponding to the part 113*u* or the part 113*l* of the conductive layer 113 described later. In the following description, the same reference numeral is given to a configuration similar to the first embodiment and the description is omitted.

The semiconductor memory device according to the second embodiment is basically configured similarly to the semiconductor memory device according to the first embodiment. However, the semiconductor memory device according to the second embodiment includes an insulating layer 215 instead of the insulating layer 115. The insulating layer 215 is basically configured similarly to the insulating layer 115. However, in the insulating layer 215, a position of a side surface of the part 115*b* on the Y-direction positive side in the Y-direction is the same as a position of a side surface of the part 115*a* on the Y-direction positive side in the Y-direction, and the parts 115*a*, 115*b* continuously extend in the X-direction.

Other Embodiments

The semiconductor memory devices according to the first embodiment and the second embodiment are described above. However, the semiconductor memory devices according to these embodiments are merely examples, and specific configurations and the like are appropriately adjustable.

For example, in the semiconductor memory devices according to the first embodiment and the second embodiment, the via-wiring 104 that functions as the bit line BL contains the conductive oxide, such as indium tin oxide (ITO). However, such a conductive oxide may be contained in the transistor structure 110, not the via-wiring 104 extending in the Z-direction. The via-wiring 104 and the transistor structure 110 may contain another material or the like.

In the semiconductor memory devices according to the first embodiment and the second embodiment, the conductive layer 113 that functions as the gate electrode of the transistor TrC may be opposed to only one of the upper surface and the lower surface of the semiconductor layer 111 that functions as the channel region of the transistor TrC.

In the above description, the example in which the capacitor CpC is employed as a memory portion connected to the transistor structure 110 is described. However, the memory portion need not be the capacitor CpC. For example, the memory portion may contain ferroelectric material, ferromagnet material, a chalcogen material such as GeSbTe, or another material and data may be stored using characteristics of these materials. For example, in any of the structures described above, any of these materials may be contained in the insulating layer between the electrodes forming the capacitors CpC.

Manufacturing methods of the semiconductor memory devices according to the first embodiment and the second embodiment are also appropriately adjustable. For example, orders of any two of the processes described above may be interchanged or any two of the processes described above may be simultaneously performed.

Others

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
- a substrate;
- a plurality of memory layers arranged in a first direction intersecting with a surface of the substrate; and
- a via-wiring extending in the first direction, wherein the plurality of memory layers each include:
- a semiconductor layer electrically connected to the via-wiring;
- a gate electrode including a first part opposed to a surface of the semiconductor layer on one side in the first direction and a second part opposed to a surface of the semiconductor layer on the other side in the first direction;
- a memory portion disposed on one side in a second direction intersecting with the first direction with respect to the semiconductor layer and electrically connected to the semiconductor layer; and
- a wiring disposed on the other side in the second direction with respect to the semiconductor layer, electrically connected to the gate electrode, and extending in a third direction intersecting with the first direction and the second direction, in a cross-sectional surface perpendicular to the first direction and including a part of the first part or the second part of the gate electrode corresponding to one of the plurality of memory layers, the via-wiring includes a first surface opposed to the gate electrode and a second surface not opposed to the gate electrode, and a part of the gate electrode is disposed on a memory portion side with respect to the via-wiring in the second direction.

2. The semiconductor memory device according to claim 1, wherein the gate electrode includes a third part extending in the first direction, and the third part is continuous with the first part and the second part.

3. The semiconductor memory device according to claim 1, further comprising a gate insulating film disposed between the semiconductor layer and the gate electrode, and in the cross-sectional surface, the gate electrode is opposed to the first surface of the via-wiring via the gate insulating film.

4. The semiconductor memory device according to claim 1, wherein in the cross-sectional surface, a surface of the gate electrode on the memory portion side is a curved surface along a circle around a center point of the via-wiring.

5. The semiconductor memory device according to claim 1, wherein in the cross-sectional surface, a surface of the gate electrode on a via-wiring side is a curved surface along a circle around a center point of the via-wiring.

6. The semiconductor memory device according to claim 1, wherein in the cross-sectional surface, a surface of the gate electrode on the memory portion side is a curved surface along a first circle around a center point of the via-wiring, a surface of the gate electrode on a via-wiring side is a curved surface along a second circle around the center point of the via-wiring, and a radius of the first circle is larger than a radius of the second circle.

7. The semiconductor memory device according to claim 1, wherein in a cross-sectional surface perpendicular to the first direction and including a part of the semiconductor layer corresponding to one of the plurality of memory layers, a surface of the semiconductor layer on the memory portion side is a curved surface along a circle around a center point of the via-wiring.

8. The semiconductor memory device according to claim 1, further comprising an insulating layer extending in the first direction, wherein in the cross-sectional surface, the second surface is opposed to the insulating layer.

9. The semiconductor memory device according to claim 1, further comprising:

a first insulating layer extending in the first direction; and a second insulating layer extending in the first direction and adjacent to the first insulating layer in the third direction, wherein the wiring includes a projecting portion projecting to a gate electrode side in the second direction, and the semiconductor layer, the gate electrode, and the projecting portion are disposed between the first insulating layer and the second insulating layer.

10. The semiconductor memory device according to claim 9, wherein in the cross-sectional surface, a surface of the second insulating layer on a first insulating layer side includes:

a third surface arranged with the gate electrode in the third direction and extending in the second direction; and a fourth surface arranged with the projecting portion in the third direction and extending in the second direction, and the fourth surface is disposed on the first insulating layer side with respect to the third surface.

11. The semiconductor memory device according to claim 9, wherein in the cross-sectional surface, a surface of the second insulating layer on a first insulating layer side includes:

a third surface arranged with the gate electrode in the third direction and extending in the second direction; and a fourth surface arranged with the projecting portion in the third direction and extending in the second direction, and the fourth surface is continuous with the third surface.

12. The semiconductor memory device according to claim 1, wherein the memory portion is a capacitor.

13. The semiconductor memory device according to claim 1, wherein the semiconductor layer includes an oxide semiconductor.

14. The semiconductor memory device according to claim 1, wherein the semiconductor layer contains at least one element of gallium (Ga) and aluminum (Al), and contains indium (In), zinc (Zn), and oxygen (O).

15. A semiconductor memory device comprising:

a substrate;

a plurality of memory layers arranged in a first direction intersecting with a surface of the substrate; and a via-wiring extending in the first direction, wherein the plurality of memory layers each include:

a semiconductor layer electrically connected to the via-wiring;

a gate electrode including a first part opposed to a surface of the semiconductor layer on one side in the first direction and a second part opposed to a surface of the semiconductor layer on the other side in the first direction;

a memory portion disposed on one side in a second direction intersecting with the first direction with respect to the semiconductor layer and electrically connected to the semiconductor layer; and a wiring disposed on the other side in the second direction with respect to the semiconductor layer, electrically connected to the gate electrode, and extending in a third direction intersecting with the first direction and the second direction, in a cross-sectional surface perpendicular to the first direction and including a part of the first part or the second part of the gate electrode corresponding to one of the plurality of memory layers:

the via-wiring includes a first surface opposed to the gate electrode and a second surface not opposed to the gate electrode, and a surface of the gate electrode on a memory portion side is a curved surface along a first circle around a center point of the via-wiring, a surface of the gate electrode on a via-wiring side is a curved surface along a second circle around the center point of the via-wiring, and a radius of the first circle is larger than a radius of the second circle.

16. The semiconductor memory device according to claim 15, further comprising an insulating layer extending in the first direction, wherein in the cross-sectional surface, the second surface is opposed to the insulating layer.

17. The semiconductor memory device according to claim 15, wherein the memory portion is a capacitor.

18. The semiconductor memory device according to claim 15, wherein the semiconductor layer includes an oxide semiconductor.

19. The semiconductor memory device according to claim 15, wherein the semiconductor layer contains at least one element of gallium (Ga) and aluminum (Al), and contains indium (In), zinc (Zn), and oxygen (O).

* * * * *